US006915665B2

(12) United States Patent
Borrelli et al.

(10) Patent No.: US 6,915,665 B2
(45) Date of Patent: Jul. 12, 2005

(54) METHOD OF INDUCING TRANSMISSION IN OPTICAL LITHOGRAPHY PREFORMS

(75) Inventors: Nicholas F. Borrelli, Elmira, NY (US); Paul S. Danielson, Corning, NY (US); Michael R. Heslin, Elmira, NY (US); Stephan L. Logunov, Corning, NY (US); Johannes Moll, Painted Post, NY (US); Paul M. Schermerhorn, Painted Post, NY (US); Charlene M. Smith, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 10/835,858

(22) Filed: Apr. 30, 2004

(65) Prior Publication Data

US 2004/0202968 A1 Oct. 14, 2004

Related U.S. Application Data

(63) Continuation of application No. 09/967,398, filed on Sep. 28, 2001, now abandoned.
(60) Provisional application No. 60/244,682, filed on Oct. 31, 2000.

(51) Int. Cl.[7] .............................................. C03C 27/00
(52) U.S. Cl. ............................ 65/111; 65/17.4; 65/30.1
(58) Field of Search ............................. 65/30.1, 30.11, 65/17.1, 17.3, 17.4, 17.6, 111, 425; 430/321, 270.1, 322, 324, 945; 250/492.1

(56) References Cited

U.S. PATENT DOCUMENTS

| 3,220,814 A | 11/1965 | Haven et al. | |
| 4,625,120 A | 11/1986 | Caprari | 250/492.1 |

(Continued)

FOREIGN PATENT DOCUMENTS

| EP | 0 483 752 | 5/1992 | |
| EP | 0 636 586 | 2/1995 | |
| EP | 0 972 753 | 1/2000 | ............ C03C/3/06 |
| EP | 0 985 643 | 3/2004 | ............ C03C/3/06 |
| JP | 60[1985]-90853 | 5/1985 | |
| JP | 1-201664 (1989) | 8/1989 | |
| JP | 05-152648 | 6/1993 | ............ H01S/3/08 |
| JP | 6-24997 (1994) | 4/1994 | |
| JP | 6-48734 (1994) | 6/1994 | |
| JP | 6[1994]-166522 | 6/1994 | |
| JP | 6[1994]-166528 | 6/1994 | |
| JP | 6-53593 (1994) | 7/1994 | |

OTHER PUBLICATIONS

Naouki Kitamura et al., *Refractive Index of Densified Silica Glass*, Journal of Non–Crystalline Solids, NL, North Holland Physics Publishing, Amsterdam, vol. 159, No. 3, Jul. 1, 1993, pp. 421–245.

(Continued)

*Primary Examiner*—Steven P. Griffin
*Assistant Examiner*—Carlos Lopez
(74) *Attorney, Agent, or Firm*—Timothy M. Schaeberle; James V. Suggs

(57) ABSTRACT

The invention provides an ultraviolet lithography method/system. The lithography method and system include providing a below 200 nm radiation source, providing a photolytically improved transmitting fused silica glass lithography optical element, transmitting below 200 nm photons through said photolytically improved transmitting fused silica glass lithography optical element to form a lithography pattern which is reduced and projected onto a radiation sensitive lithography printing medium to form a printed lithography pattern. Providing the photolytically improved transmitting fused silica glass lithography optical element includes providing a photolytically improved transmitting fused silica glass lithography optical element preform body and forming the photolytically improved transmitting fused silica glass lithography optical element preform into said lithography optical element.

27 Claims, 22 Drawing Sheets

CHANGE IN INTERNAL TRANSMITTANCE, HPFS AFTER 1X10⁹ PULSES @ 1mJ/cm²<PULSE.

| $H_2$ CONCENTRATION | INITIAL(T) 193nm % T/cm | FINAL(IN) 193nm % T/cm | $\Delta T$ AT 193nm |
|---|---|---|---|
| $5.1 \times 10^{17}$ | 99.31 | 99.48 | +.17 |
| $1.25 \times 10^{17}$ | 99.43 | 99.55 | +.12 |

U.S. PATENT DOCUMENTS

| | | | |
|---|---|---|---|
| 4,789,389 A | 12/1988 | Schermerhorn et al. | 65/390 |
| 4,857,092 A | 8/1989 | Meerman | 65/427 |
| 4,961,767 A | 10/1990 | Schermerhorn et al. | 65/427 |
| 5,086,352 A | 2/1992 | Yamagata et al. | 359/350 |
| 5,161,059 A | 11/1992 | Swanson et al. | 359/565 |
| 5,210,816 A * | 5/1993 | Iino et al. | 385/142 |
| 5,325,230 A | 6/1994 | Yamagata et al. | 359/350 |
| 5,410,428 A | 4/1995 | Yamagata et al. | |
| 5,547,482 A | 8/1996 | Chalk et al. | 65/17.2 |
| 5,597,395 A | 1/1997 | Bocko et al. | 65/33.4 |
| 5,616,159 A | 4/1997 | Araujo et al. | 65/17.4 |
| 5,668,067 A | 9/1997 | Araujo et al. | |
| 5,773,486 A | 6/1998 | Chandross et al. | |
| 5,983,673 A | 11/1999 | Urano et al. | 65/30.1 |
| 6,058,739 A | 5/2000 | Morton et al. | 65/30.1 |
| 6,205,818 B1 | 3/2001 | Seward, III | 65/33.2 |
| 6,263,706 B1 * | 7/2001 | Deliso et al. | 65/397 |
| 6,266,978 B1 | 7/2001 | Oshima et al. | 65/33.2 |
| 6,319,634 B1 * | 11/2001 | Berkey et al. | 430/5 |
| 6,333,283 B1 | 12/2001 | Urano et al. | 501/54 |
| 6,333,284 B1 * | 12/2001 | Otsuka et al. | 501/54 |
| 6,410,192 B1 | 6/2002 | Priestly et al. | 430/5 |
| 6,466,365 B1 | 10/2002 | Maier et al. | 359/355 |
| 6,497,118 B1 | 12/2002 | Schermerhorn | 65/17.4 |
| 6,541,168 B2 * | 4/2003 | Brown et al. | 430/5 |
| 6,544,914 B1 | 4/2003 | Kikugawa et al. | 501/54 |
| 6,550,277 B1 | 4/2003 | Uebbing et al. | 65/17.4 |
| 6,653,024 B1 * | 11/2003 | Shiraishi et al. | 430/5 |
| 6,782,716 B2 * | 8/2004 | Moore et al. | 65/30.1 |
| 2002/0018942 A1 | 2/2002 | Brown et al. | 430/5 |
| 2002/0160276 A1 | 10/2002 | Moore et al. | 430/5 |
| 2003/0121283 A1 | 7/2003 | Yu | 65/17.2 |
| 2004/0091798 A1 * | 5/2004 | Moore et al. | 430/5 |

OTHER PUBLICATIONS

Shelby, JE, *Radiation Effects In Hydrogen–Impregnated Vitreous Silica*, Journal of Applied Physics, vol. 50, No. 5, May 1979, pp. 3702–3706.

D.R. Sempolinski, T.P. Seward, C. Smith, N. Borrelli, C. Rosplock, entitled *Effects Of Glass Forming Conditions On The KrF–Excimer–Laser–Induced Optical Damage In Synthetic Fused Silica*, Journal of Non–Crystalline Solids 203 (1996) pp. 69–77.

Primak et al., The Radiation Compaction of Vitreous Silica, J. Appl. Phys. 39, 5651–5658 (Nov. 1968).

Schermerhorn P., Excimer Laser Damage Testing of Optical Materials, SPIE, 1835:70–79, 1992.

EerNisse, E., Compaction of Ion Implanted Fused Silica, J. Appl. Phys., 45:167–174, Jan. 1994.

Ruller et al., The Effect of Gamma–Irradiationon the Density of Various Types of Silica, Journal of Non–Crystalline Solids, 136:163–172, 1991.

Rothschild et al., Effects of Excimer Laser Irradiationon the Transmission, Index of Refraction, and Density of Ultraviolet Grade Fused Silica, Appl. Phys. Lett. 55:1276–1278, Sep. 1989.

Primak, W., Section C, Ionization Compaction in the Compacted States of Viterous Silica, vol. 4 of Studies in Radiation Effects in Solids, edited by GJ. Dienes and LT. Chadderton (Gordon and Breach, 1975), 91–102.

* cited by examiner

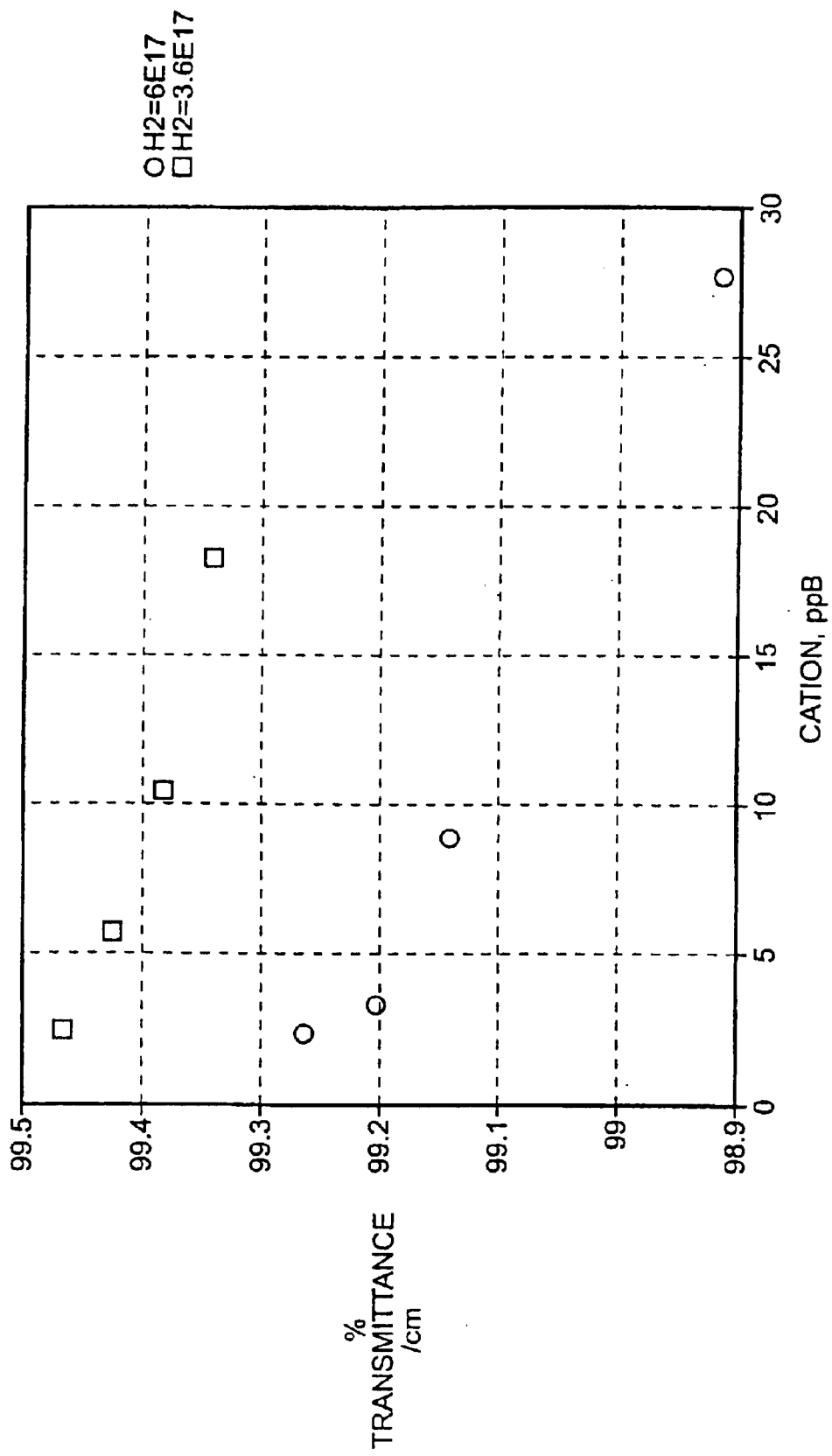
FIG. 17 H₂ AND TRANSMITTANCE AT CONSTANT IMPURITY (Na).

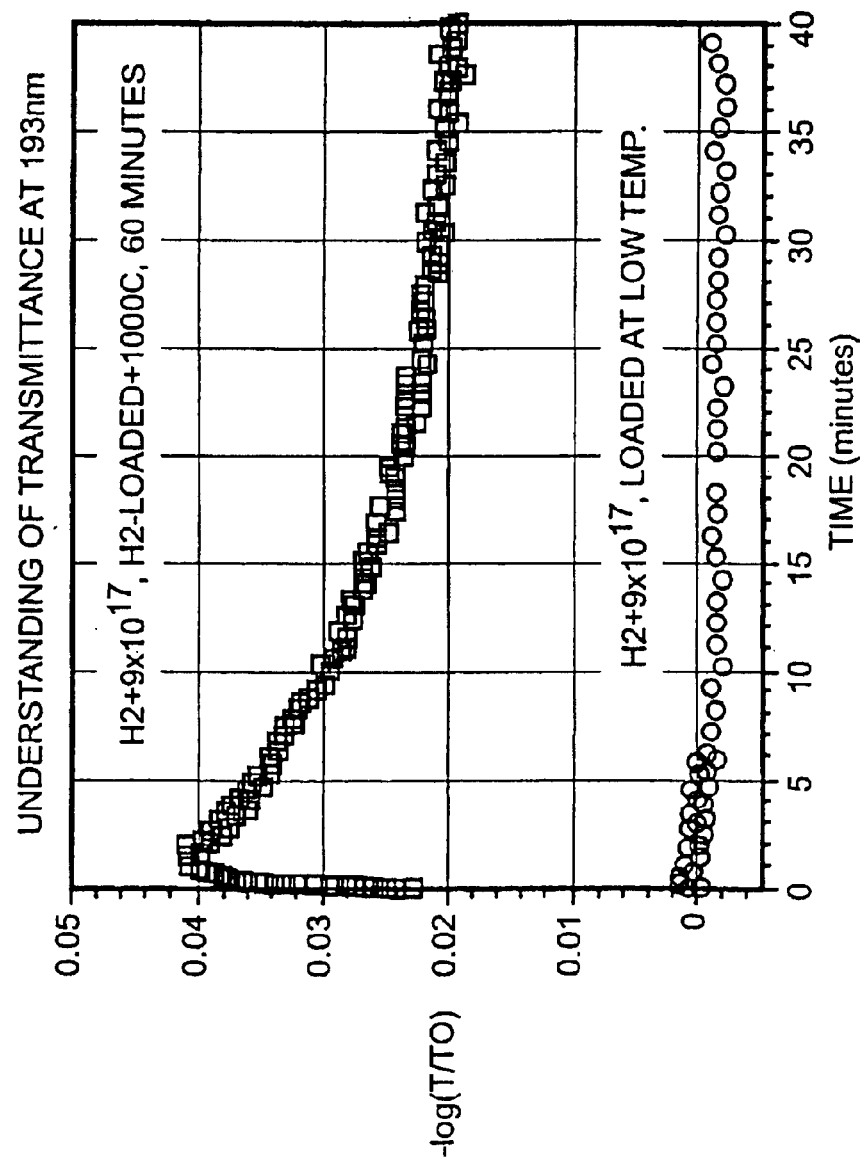
FIG. 18 INDUCED ABS @ 215nm.

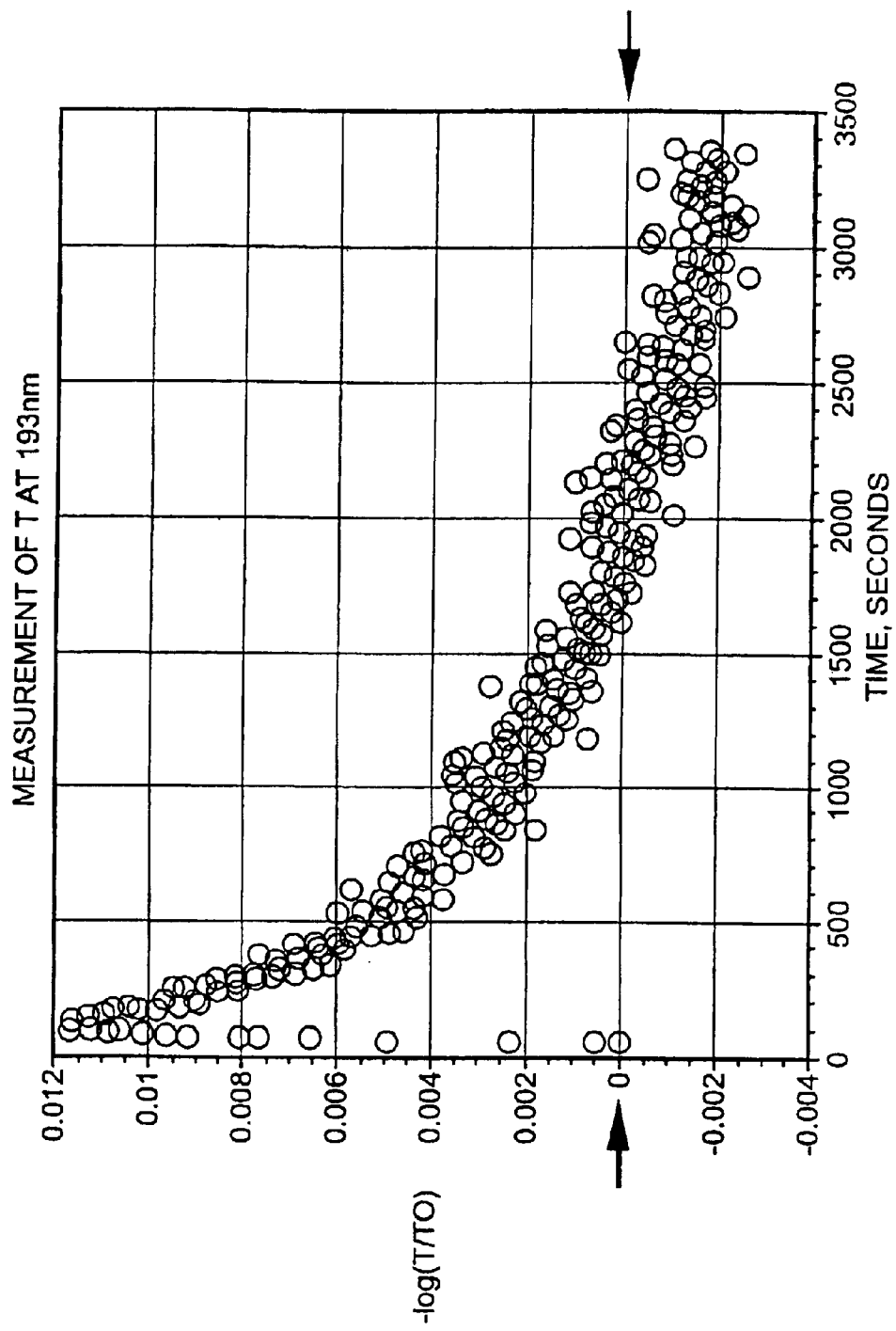
FIG. 19 INDUCED 193nm T. T @ TIME = 2000 SEC (~0.8x10² PULSES) IS GREATER THAN AT TIME = 0.

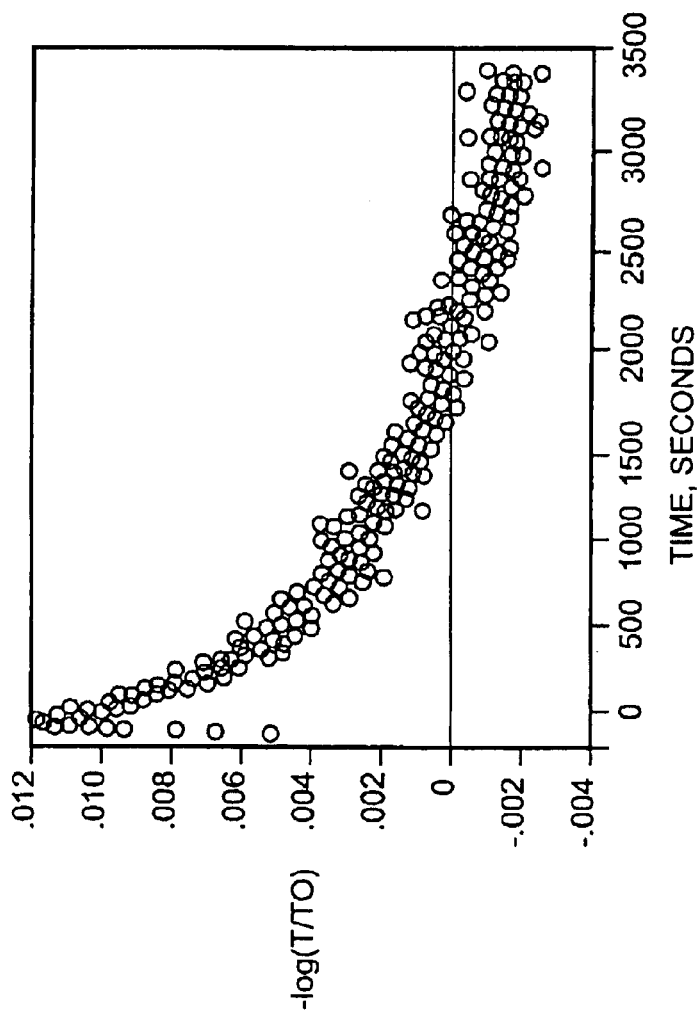
FIG. 20 CHANGE IN INTERNAL TRANSMITTANCE, HPFS AFTER 1X10⁹ PULSES @ 1mJ/cm² <PULSE.

FIG. 21A  EFFECT OF Xe EXPOSURE OF INTERNAL 193 nm TRANSMITTANCE.
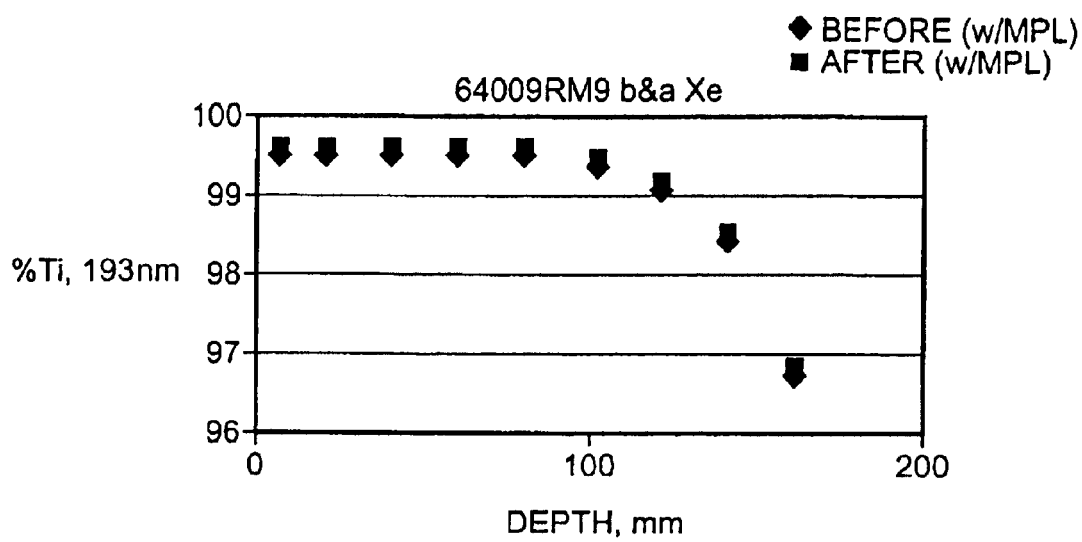
FIG. 21B  EFFECT OF Xe EXPOSURE OF INTERNAL 193 nm TRANSMITTANCE.
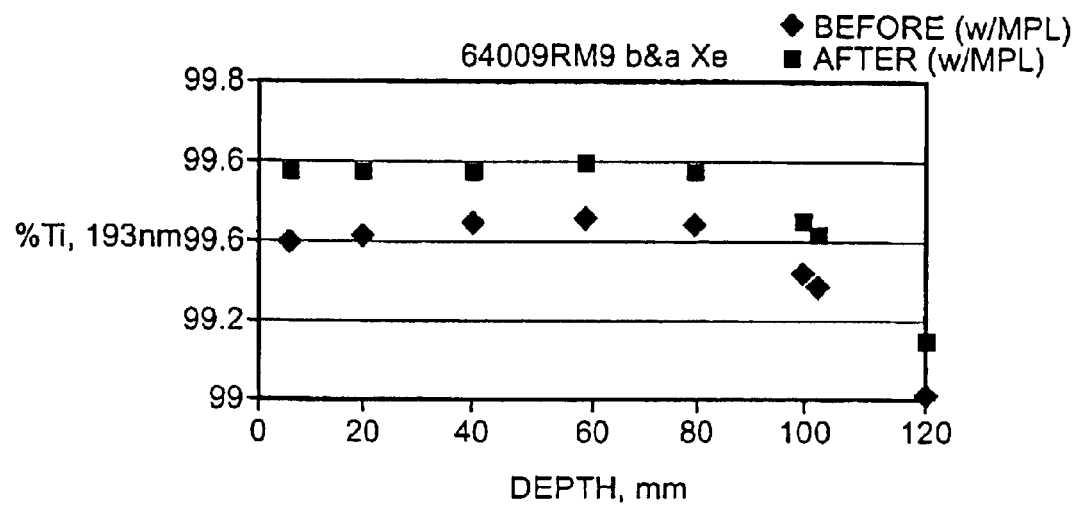

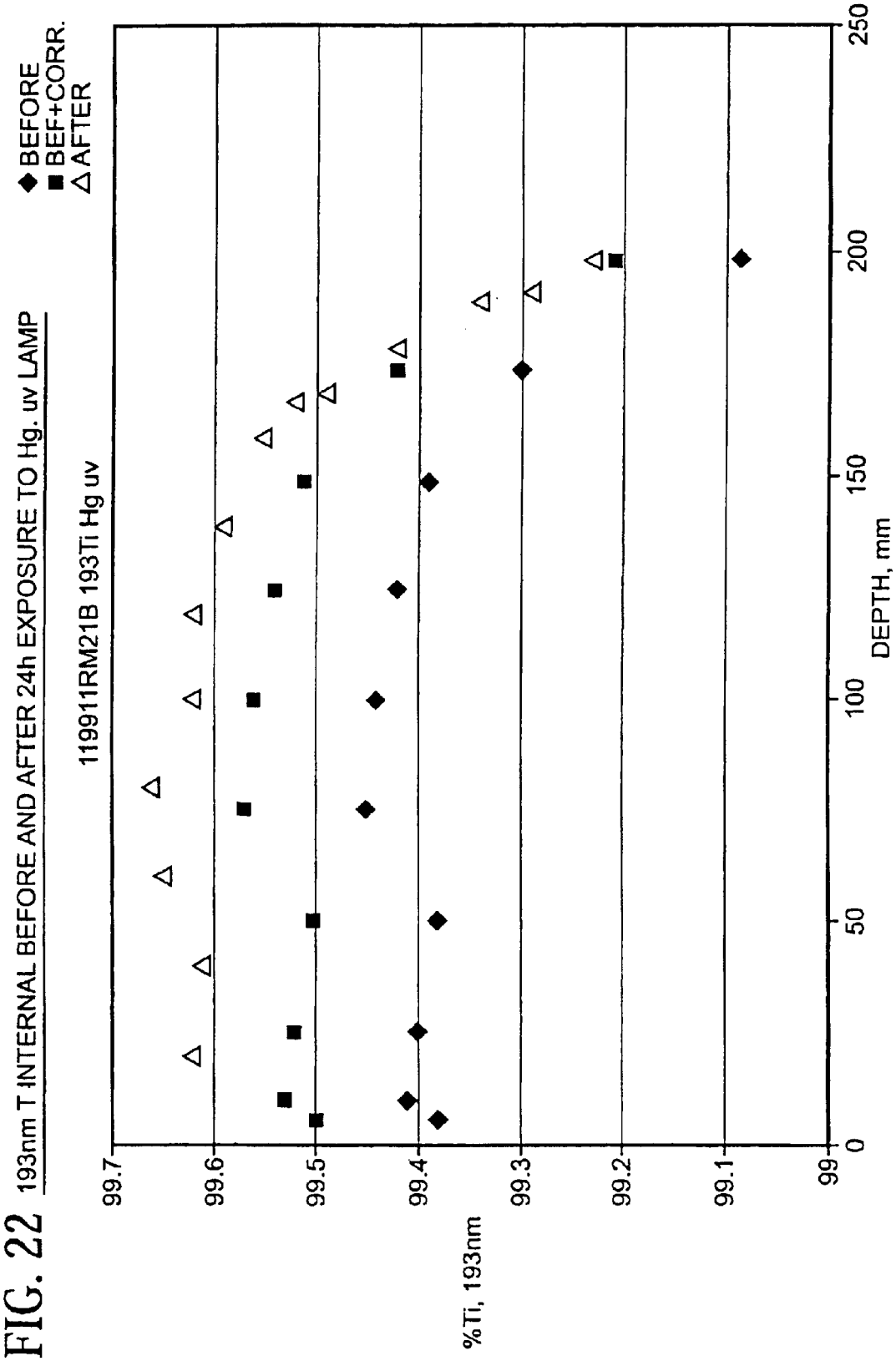
FIG. 22 193nm T INTERNAL BEFORE AND AFTER 24h EXPOSURE TO Hg. uv LAMP

METHOD OF INDUCING TRANSMISSION IN OPTICAL LITHOGRAPHY PREFORMS

This application is a continuation under 35 U.S.C. §120 of U.S. patent application Ser. No. 09/967,398, entitled "OPTICAL LITHOGRAPHY AND A METHOD OF INDUCING TRANSMISSION IN OPTICAL LITHOGRAPHY PREFORMS," filed on Sep. 28, 2001, now abandoned. Applicant claims the benefit of priority under 35 U.S.C. §120 of the above-referenced application. Applicant also claims the benefit of priority under 35 U.S.C. §119(e) of U.S. Provisional Patent Application Ser. No. 60/244,682, filed Oct. 31, 2000.

FIELD OF THE INVENTION

The present invention relates generally to optical projection lithography methods and photolithography, and particularly to optical photolithography systems utilizing ultraviolet light (UV) wavelengths below 200 nm, such as UV lithography systems utilizing wavelengths in the 193 nm region.

BACKGROUND OF THE INVENTION

Projection optical photolithography methods/systems that utilize the ultraviolet wavelengths of light below 200 nm provide benefits in terms of achieving smaller feature dimensions. Such methods/systems that utilize ultraviolet wavelengths in the 193 nm wavelength regions have the potential of improving the manufacturing of integrated circuits with smaller feature sizes but the commercial use and adoption of below 200 nm UV in high volume mass production of integrated circuits has been slow. Part of the slow progression to below 200 nm UV by the semiconductor industry has been due to the lack of economically manufacturable optical photolithography element high purity fused silica glass with high quality optical performance. For the benefit of ultraviolet photolithography in the 193 nm region such as the ArF excimer laser emission spectrum to be utilized in the manufacturing of integrated circuits there is a need for optical photolithography element fused silica glass and optical elements thereof that have beneficial optical properties and that can be manufactured economically and utilized with below 200 nm UV photons.

There is a need for photolytically improving below 300 nm transmission of lithography optical element fused silica glass.

There is a need for photolytically inducing below 300 nm transmission of fused silica glass.

There is a need for photolytically inducing below 300 nm transmission of lithography element fused silica glass which has non-impregnated hydrogen wherein $H_2$ is incorporated into the fused silica glass at the time the glass is made by molten fusing silica particles together.

There is a need for quality improvement and photolytically inducing below 300 nm transmission of fused silica glass which includes SiH* species.

There is a need for quality improvement and photolytically inducing below 300 nm transmission of fused silica glass which includes SiH* species and a $H_2$ content less than $2 \times 10^{17}$ molecules/$cm^3$.

SUMMARY OF THE INVENTION

The invention includes a deep ultraviolet lithography method. The deep ultraviolet lithography method includes providing a lithography UV λ radiation source for producing photons, providing a photolytically improved transmitting fused silica glass lithography optical element, and transmitting the produced lithography photons through the photolytically improved transmitting fused silica glass lithography optical element. The method includes forming a lithography pattern with the photons and projecting the lithography pattern onto a radiation sensitive lithography printing medium to form a printed lithography pattern.

The invention further includes a method of making an optical element fused silica glass. The method of making includes providing an optical element fused silica glass having a below 300 nm internal transmission T (%/cm) and photolytically exposing the fused silica glass with a <300 nm photonic exposure to provide a photolytically improved transmitting fused silica glass with a below 300 nm increased internal transmittance IN (%/cm) in which IN−T=Δ transmittance (%/cm) and Δ transmittance ≧0.07.

BRIEF DESCRIPTION OF THE DRAWINGS

FIG. 17 is a plot of % Transmittance/cm at 193 nm (y-axis) versus cation impurity content ppb of Na for two levels of $H_2$ in fused silica glass.

FIG. 18 is a plot of induced 215 nm absorbance/cm [−log (T/TO)] (y-axis) versus pulse number of 1193 nm (6 mJ/$cm^2$/pulse) [Time (minutes)] (x-axis).

FIG. 19 is a plot of induced 193 nm absorbance/cm [−log (T/TO)] (y-axis) versus pulse number of 193 nm (6 mJ/$cm^2$/pulse at rep. rate of 400 HZ) [Time (seconds)] (x-axis).

FIG. 20 is a plot of induced 193 nm absorbance/cm [−log (T/TO)] (y-axis) versus exposure time (seconds) to 193 nm excimer laser light.

FIGS. 21A–21B are plots of internal transmittance at 193 nm versus depth (mm) of fused silica glass exposed to Xe lamp non-coherent exposure.

FIG. 22 is a plot of internal transmittance at 193 nm versus depth (mm) of fused silica glass exposed to mercury UV lamp.

DETAILED DESCRIPTION OF THE INVENTION

Figure 1:
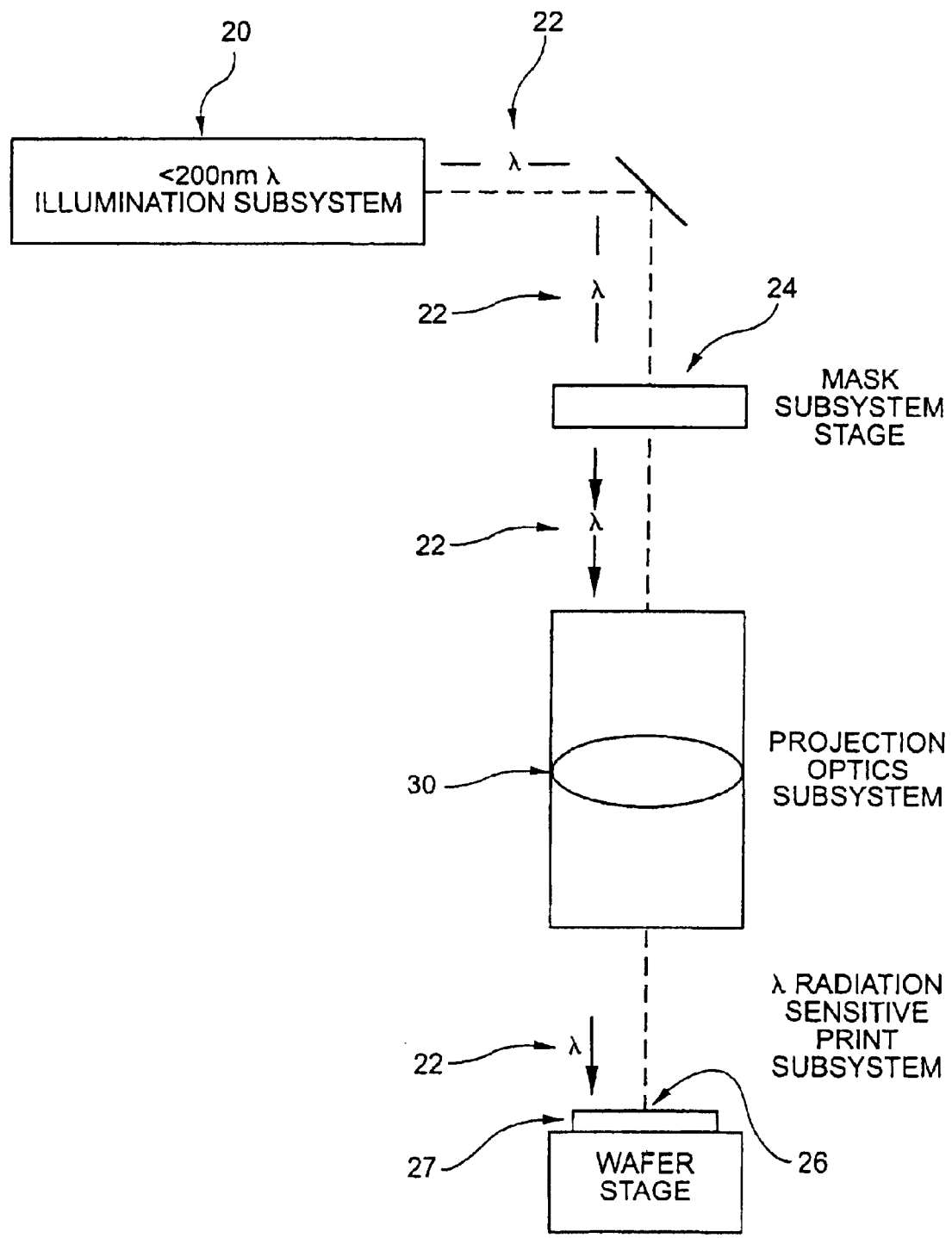
FIG. 1 illustrates an ultraviolet lithography method and system in accordance with the invention.
Figure 2:
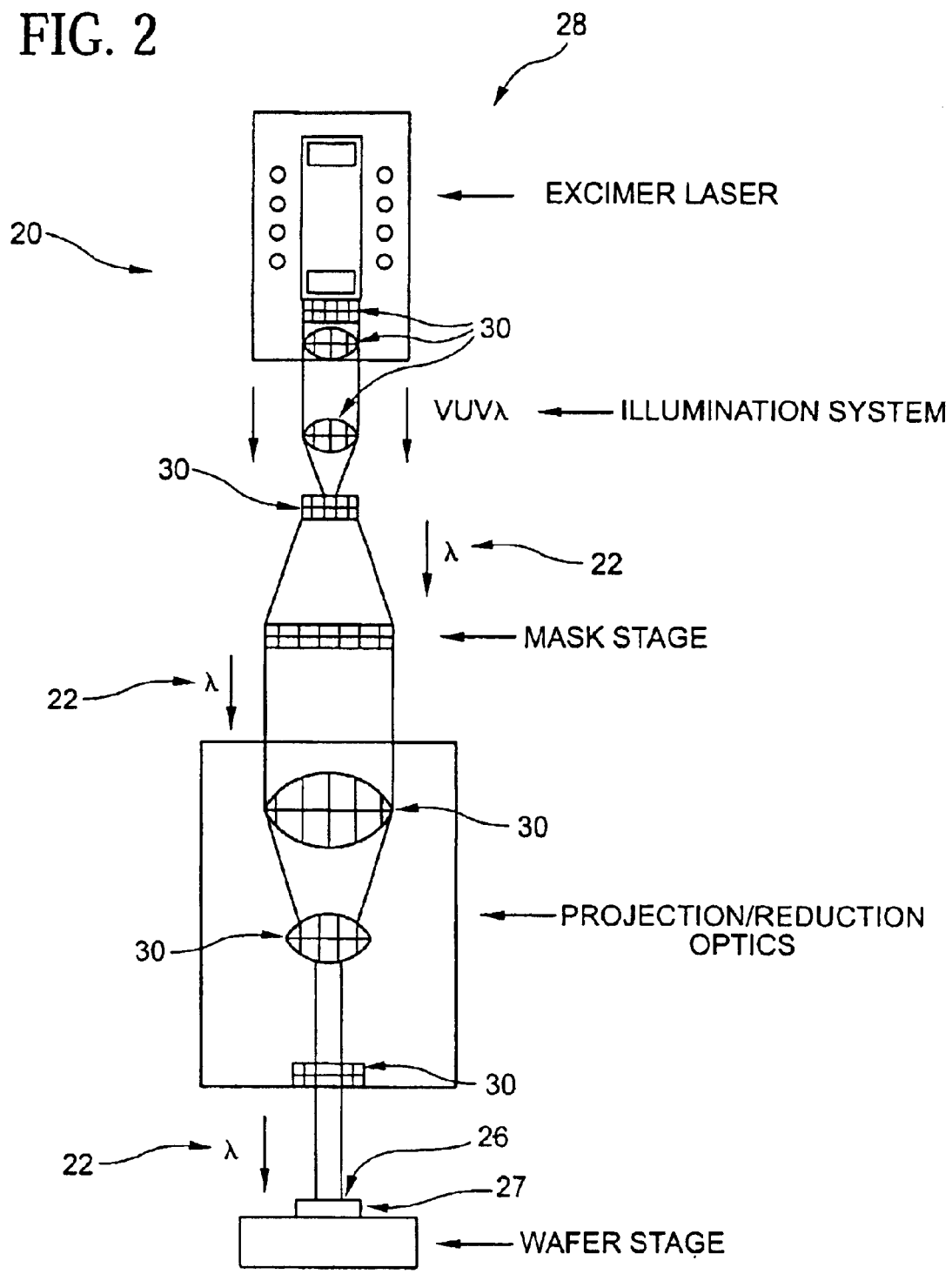
FIG. 2 illustrates an ultraviolet lithography method and system in accordance with the invention.
Figure 3:
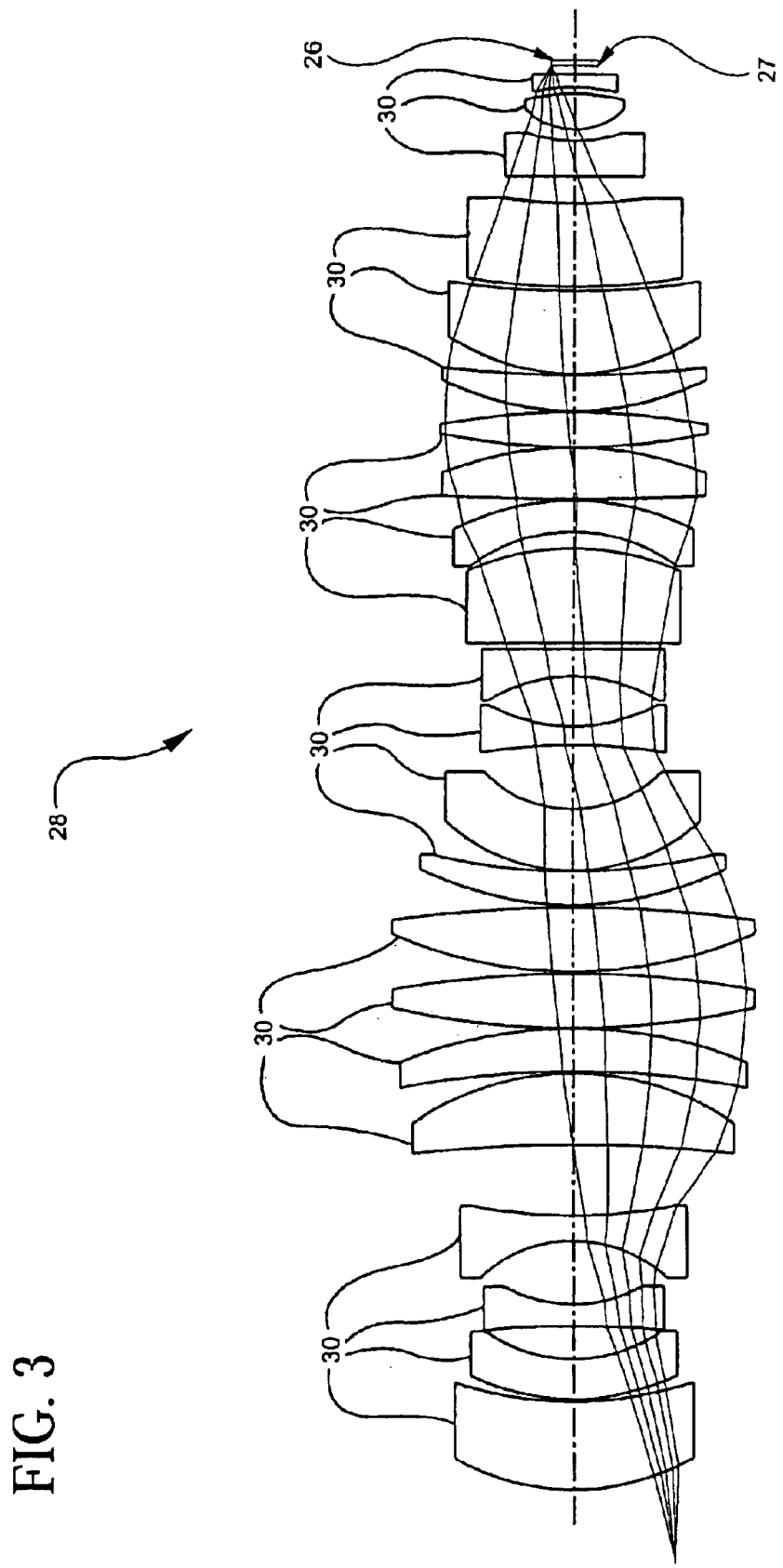
FIG. 3 illustrates an ultraviolet lithography method and system in accordance with the invention.
Figure 4:
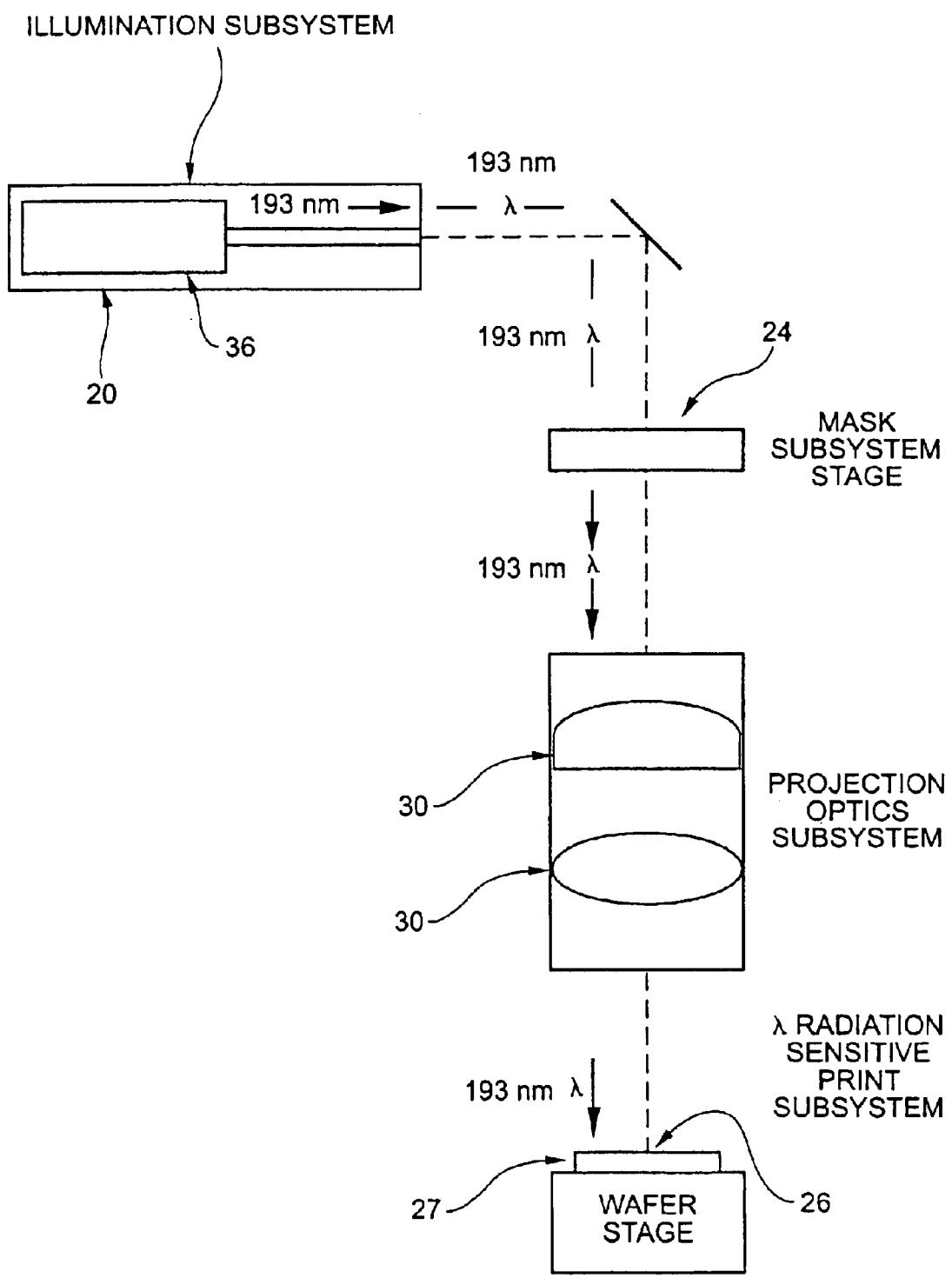
FIG. 4 illustrates an ultraviolet lithography method and system in accordance with the invention.
Figure 5:
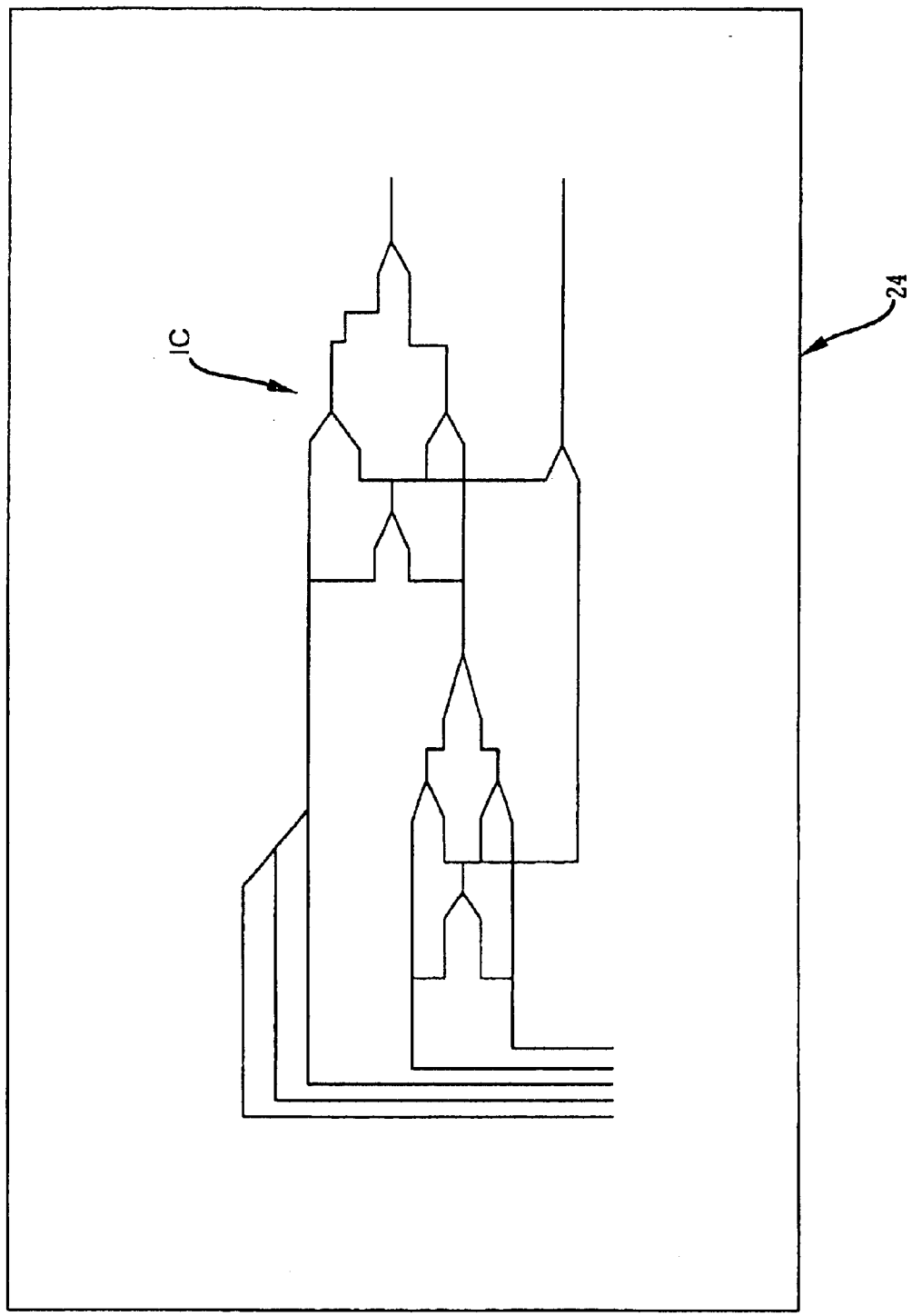
FIG. 5 illustrates a lithography pattern method in accordance with the invention.
Figure 6:
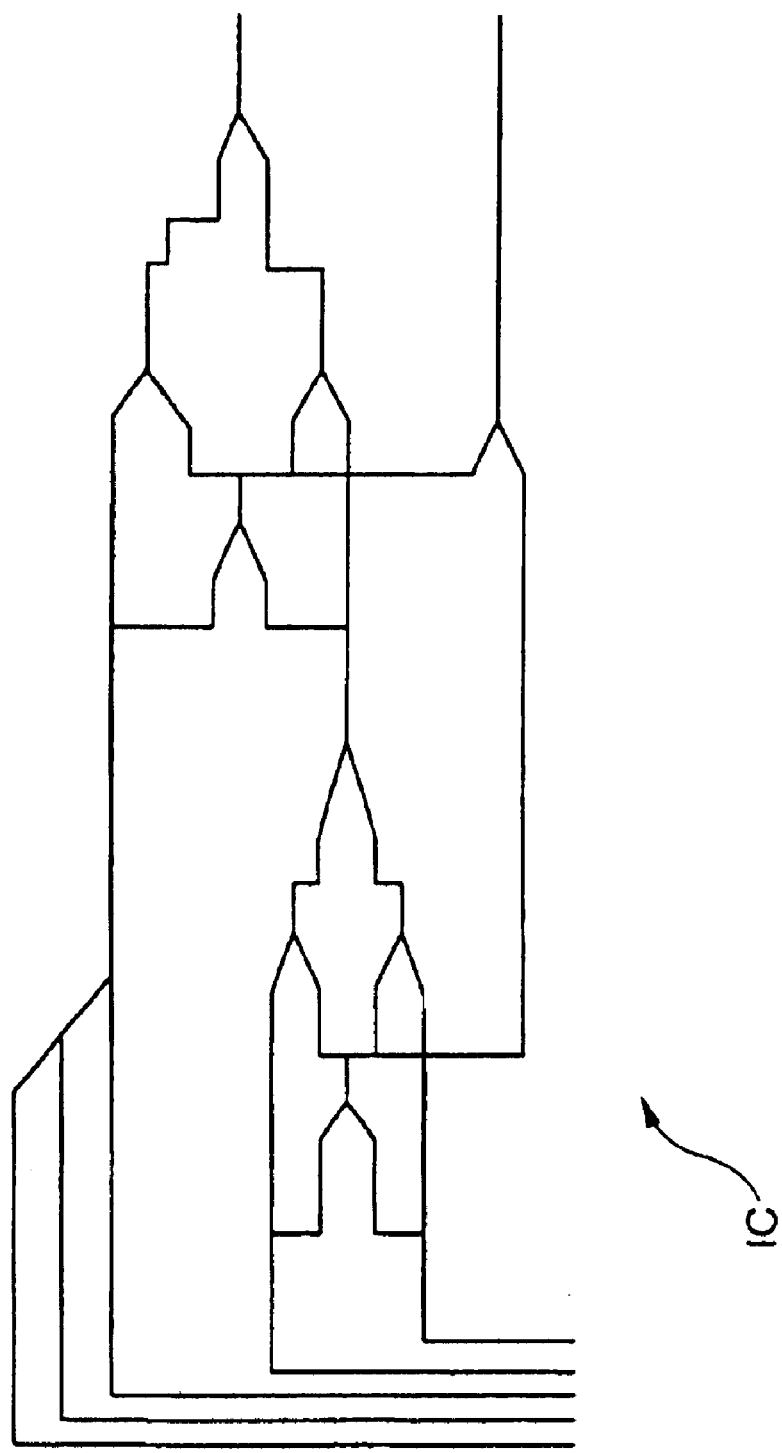
FIG. 6 illustrates a lithography pattern method in accordance with the invention.
Figure 7:
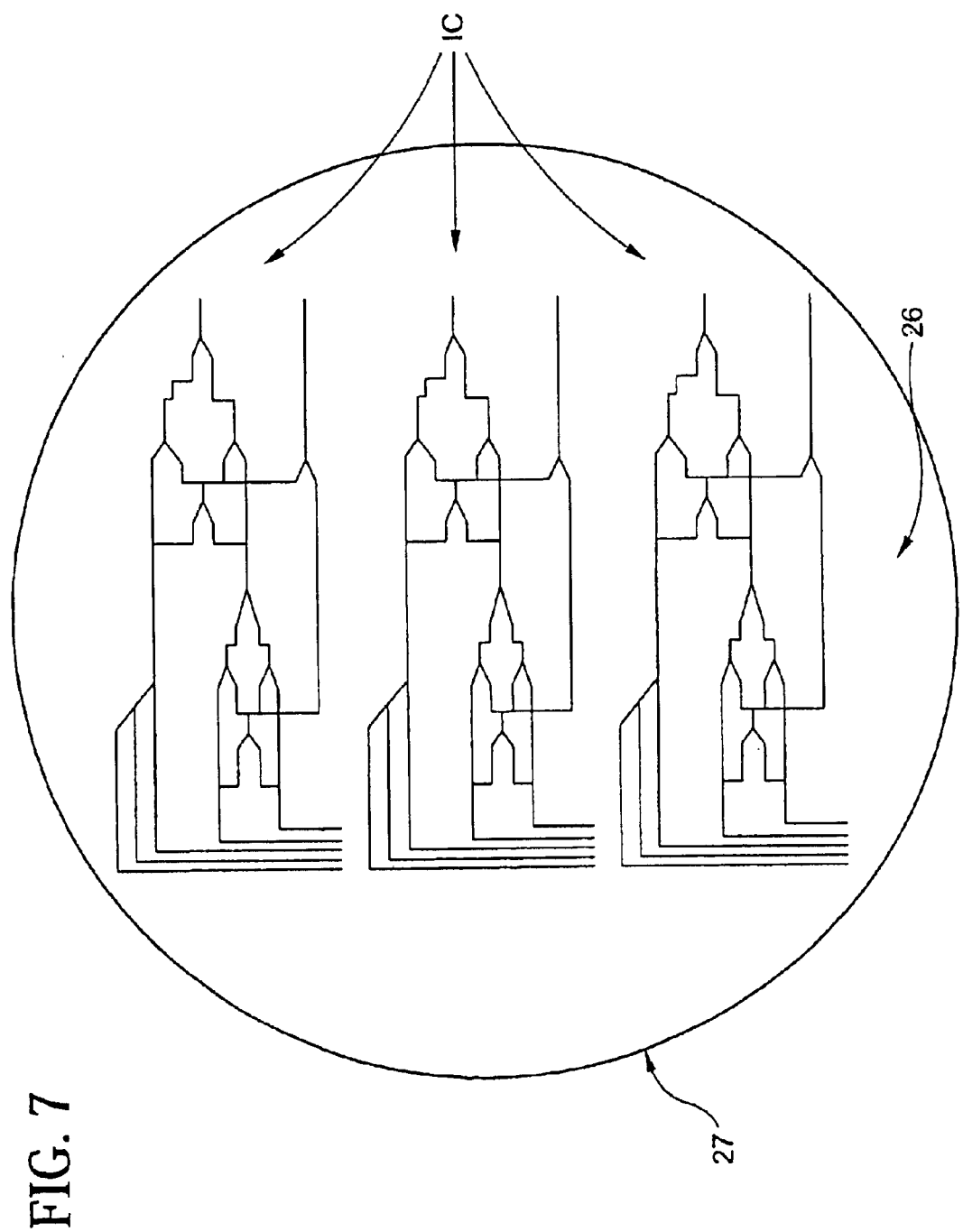
FIG. 7 illustrates a lithography pattern method in accordance with the invention.
Figure 8:
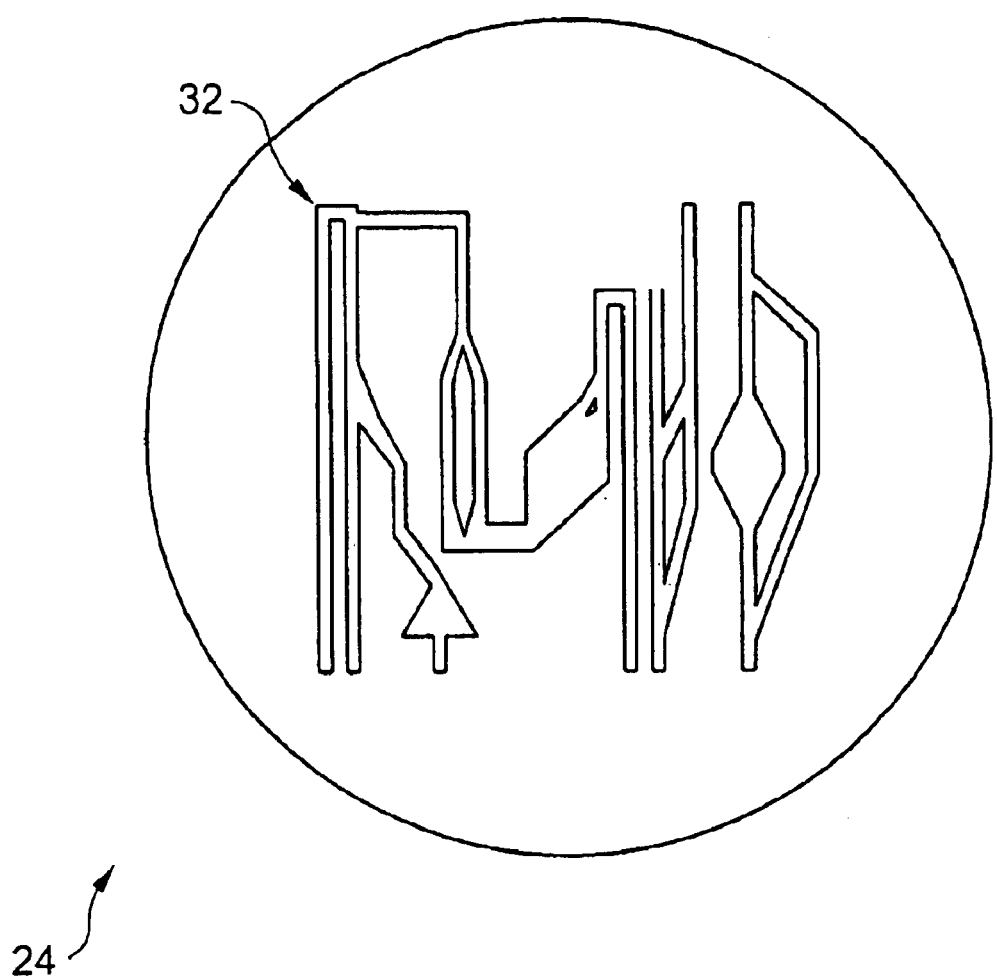
FIG. 8 illustrates a lithography pattern method in accordance with the invention.
Figure 9:
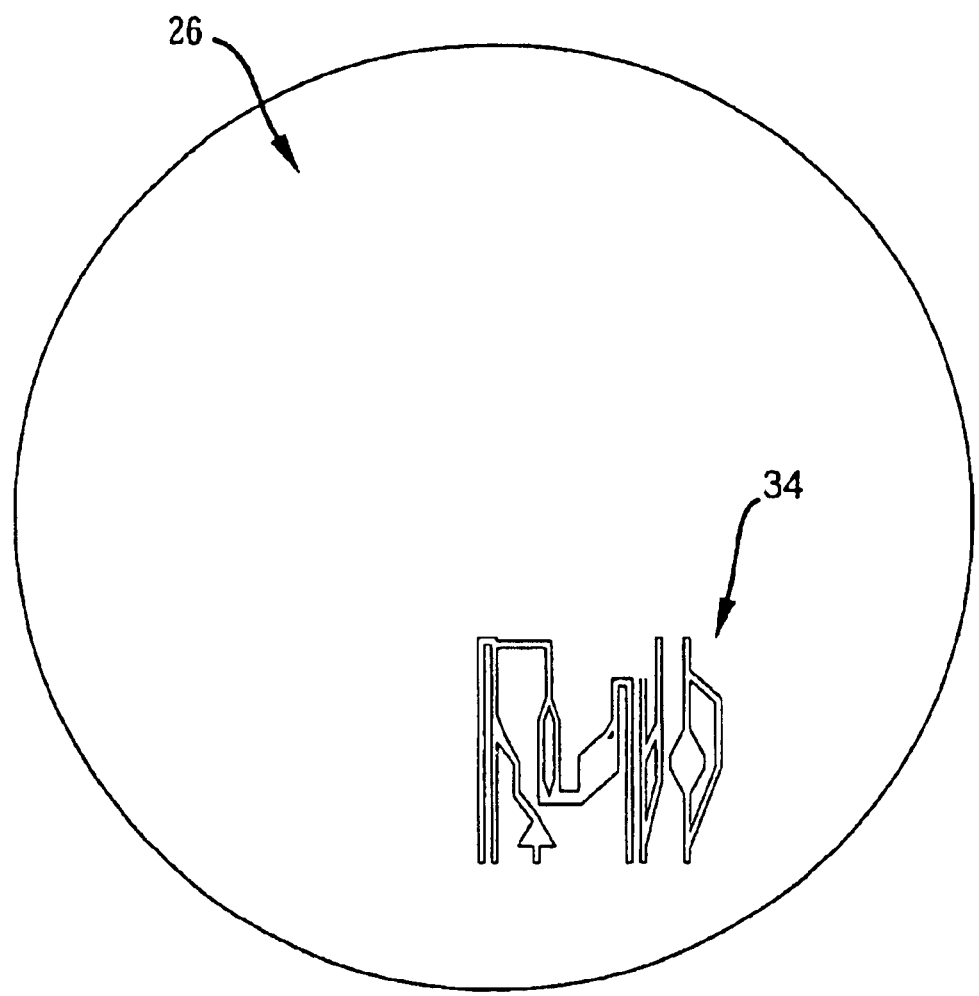
FIG. 9 illustrates a lithography pattern method in accordance with the invention.
Figure 10:
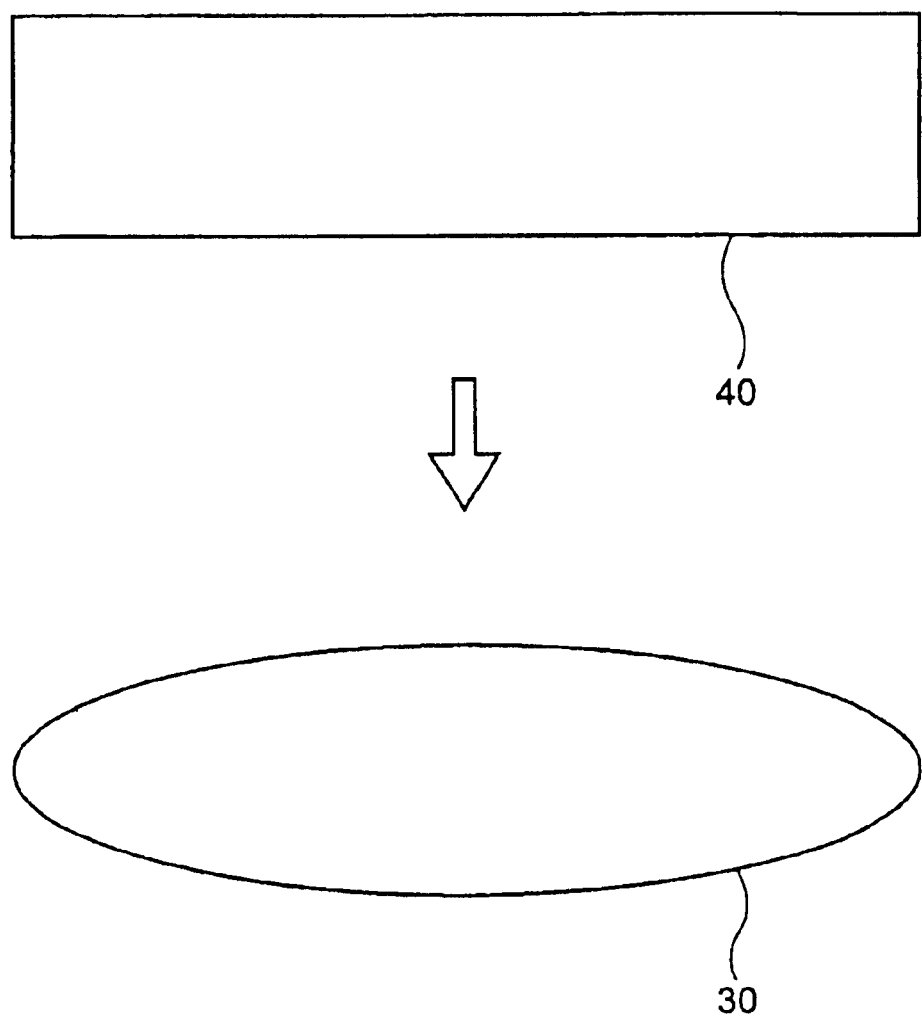
FIG. 10 illustrates a method in accordance with the invention and shows an optical element and preform thereof in accordance with the invention.

The invention includes an ultraviolet lithography method. As shown in FIG. 1, the method includes providing a below 200 nm λ wavelength radiation source 20 for producing photons 22 and providing a photolytically improved transmitting fused silica glass lithography element 30. The method includes transmitting below 200 nm lithography photons 22 through photolytically improved transmitting fused silica glass lithography optical element 30. The method includes forming a lithography pattern with lithography photons 22 and reducing the lithography pattern and projecting the lithography pattern onto a radiation sensitive lithography printing medium 26 to form a printed lithography pattern. As shown in FIG. 2 the lithography method/system 28 of the invention preferably utilizes a plurality of photolytically improved transmitting fused silica glass lithography optical elements 30. As shown in FIG. 3, the lithography method/system 28 can include a large multitude of photolytically improved transmitting fused silica glass lithography optical elements 30 which manipulate the lithography photons and lithography pattern to form a printed lithography pattern on printing medium 26 of wafer 27. FIG. 5 shows a lithography pattern IC on a lithography mask 24. As sown in FIG. 6 the transmission properties of mask 24 and pattern IC form a lithography pattern IC with the below 200 nm lithography photons. As shown in FIG. 7 the lithography pattern IC is reduced and projected onto wafer 27. Similarly the mask pattern 32 of mask 24 of FIG. 8 is reduced and projected onto radiation sensitive lithography medium 26 of FIG. 9 to provide printed lithography pattern 34. In a preferred embodiment, such as shown in FIG. 4, providing radiation source 20 includes providing an ArF excimer laser 36 and producing 193 nm lithography photons. Providing photolytically improved transmitting fused silica glass lithography optical element 30 includes providing a photolytically improved transmitting fused silica glass lithography optical element preform body 40 and forming the preform 40 into lithography optical element 30. As shown in FIG. 10 fused silica glass optical element preform 40 is shaped into optical element lens 30. Forming optical element 30 preferably includes shaping the preform with grinding and polishing to provide the optical shape of element 30. Element 30 can also be coated and mounted in a housing for assembly. FIG. 10 shows the cross-section of preform 40, which is preferably a disc cylinder, and the cross-section of optical element 30. The fused silica glass preform body 40 is preferably photolytically exposed to improve its transmission in accordance with the invention, prior to being shaped in optical element 30.

Figure 11:
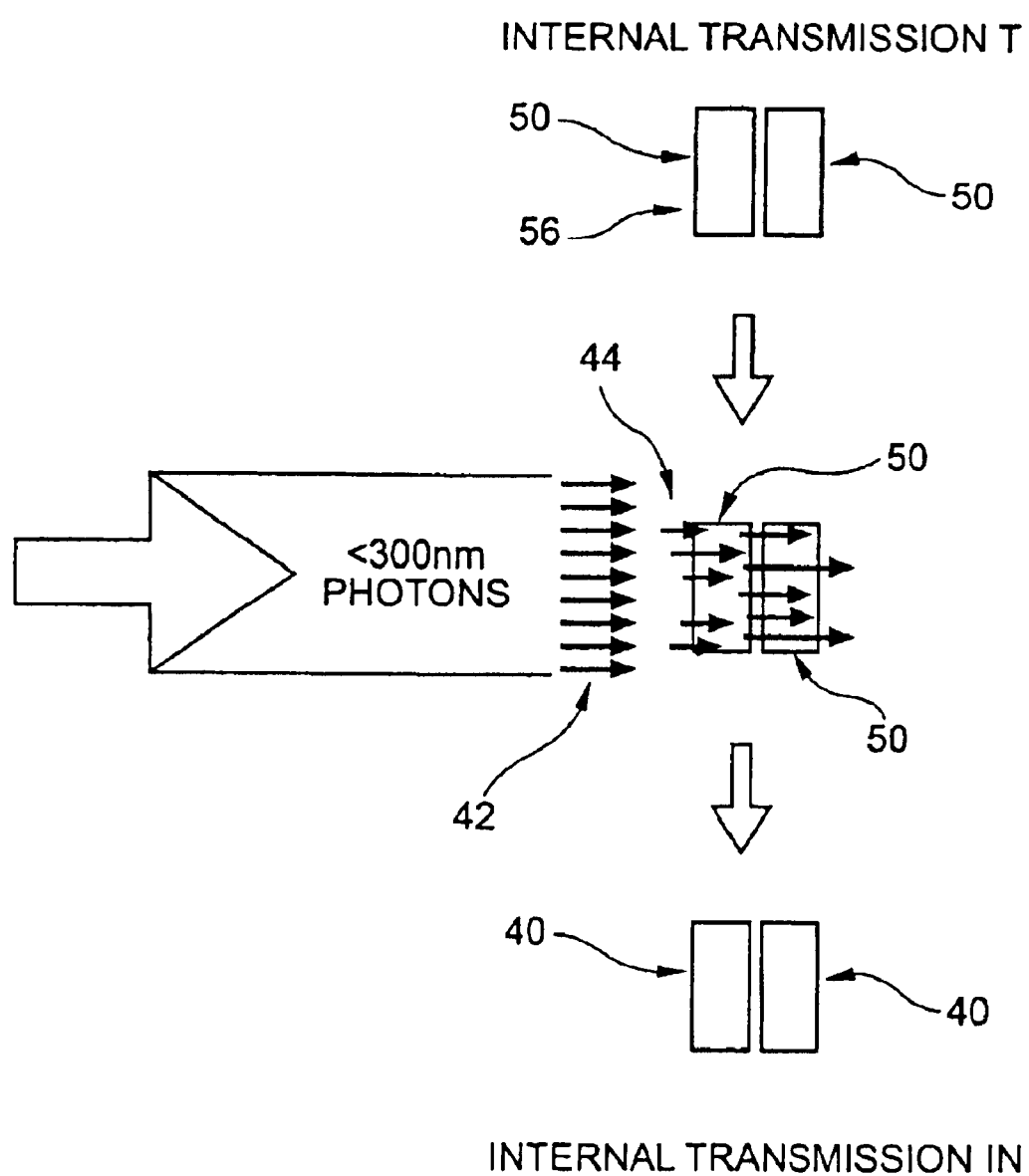
FIG. 11 illustrates a method in accordance wit the invention.
Figure 12:
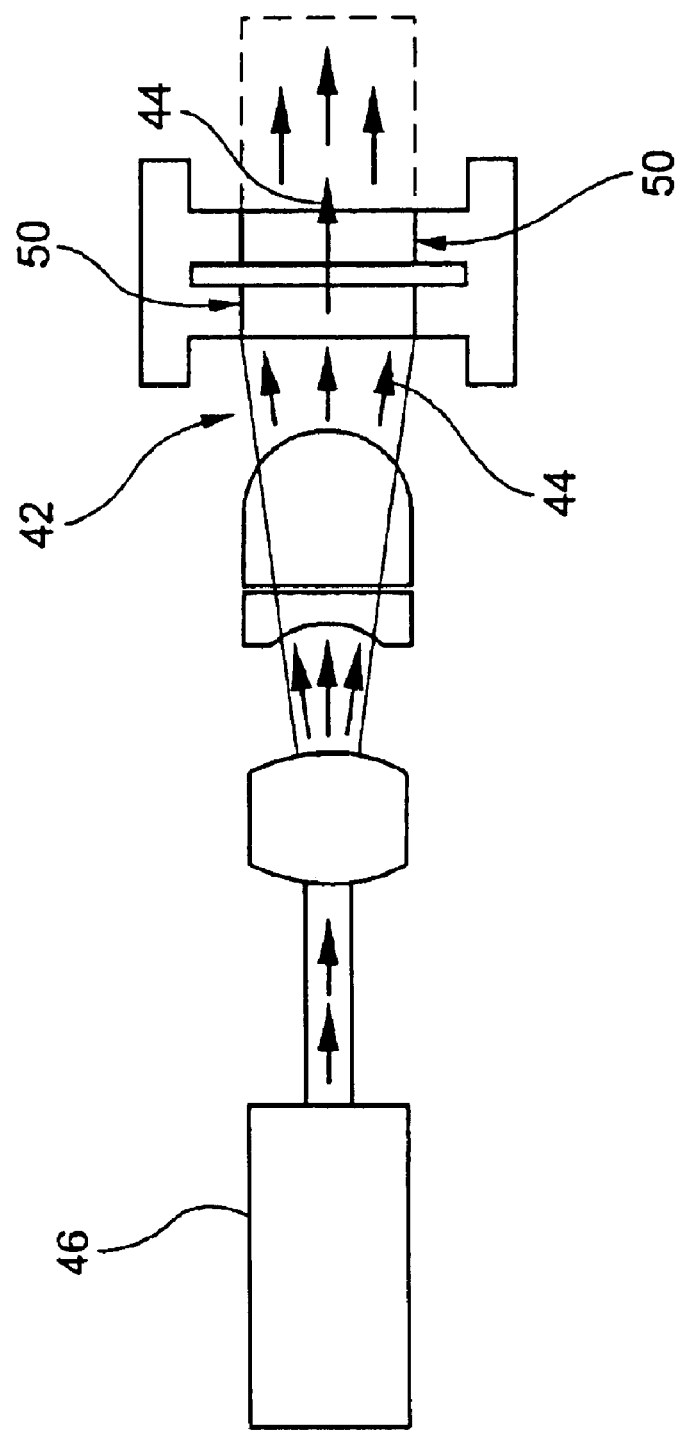
FIG. 12 illustrates a method and system in accordance with the invention.
Figure 13:
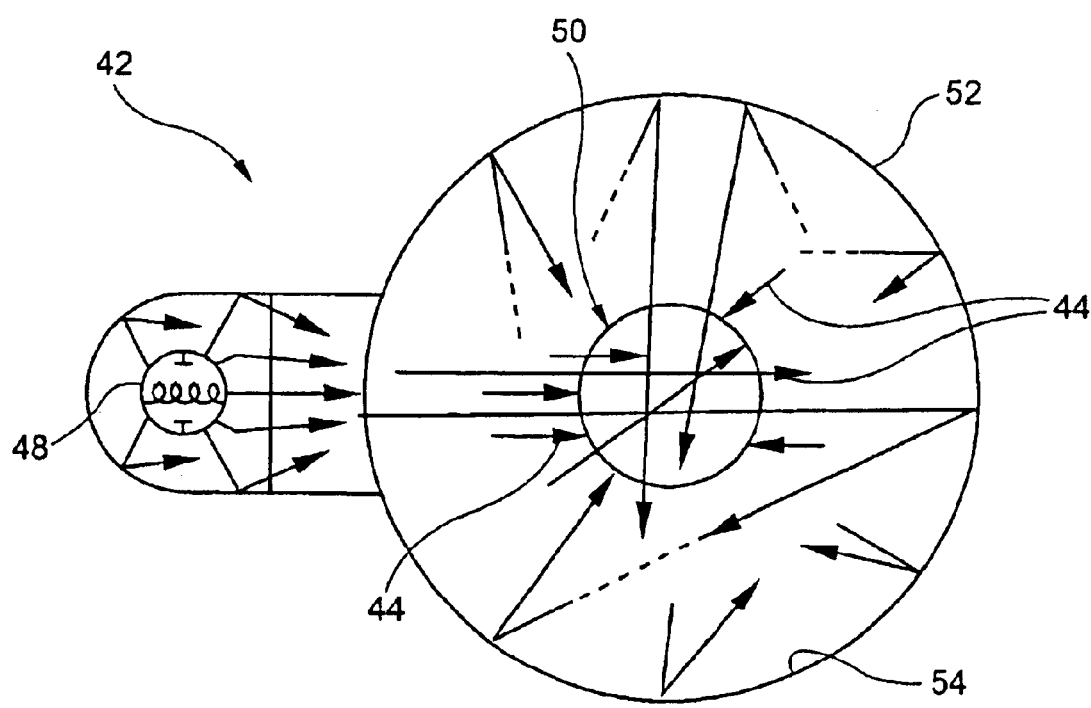
FIG. 13 illustrates a method and system in accordance with the invention.

Providing photolytically improved transmitting fused silica glass lithography optical element preform body 40 includes providing an optical element fused silica glass body 50 having a below 200 nm unbleached internal transmission T (%/cm) and photolytically exposing the fused silica glass with a <300 nm photonic exposure to provide a photolytically improved transmitting fused silica glass body with a below 200 nm increased internal transmittance IN (%/cm) with IN−T=Δ transmittance (%/cm) and Δ transmittance >0.07. As shown in FIG. 11, the method includes providing optical element fused silica glass bodies 50 having below 200 nm unbleached internal transmission T (%/cm) and photolytically exposing fused silica glass preforms 50 with <300 nm photonic exposure 42. Preforms 50 are exposed for a time and a photonic exposure fluence such that the internal transmission of the preform is increased to an improved internal transmission IN which is at least 0.07 (%/cm) greater than the pre-exposed virgin internal transmission T of the pre-exposed virgin glass of preform 50. As shown in FIG. 11, photolytically exposing the fused silica glass includes providing a <300 nm light 44 impinging on the fused silica glass. FIGS. 12–13 show embodiments of photolytically exposing preform 50 with <300 nm light 44. Preferably the photolytic exposure of fused silica glass preform 50 includes optically manipulating the <300 nm light. In FIG. 12 the <300 nm exposure light is optically manipulated by beam expanding the coherent laser beam produced by <300 nm laser 46. In a preferred embodiment laser 46 is an excimer laser. In FIG. 13 the <300 nm exposure light produced by light source 48 is optically manipulated by integrating sphere 52 and the <300 nm light reflecting surface 54 of the interior of integrating sphere 52.

Figure 14:
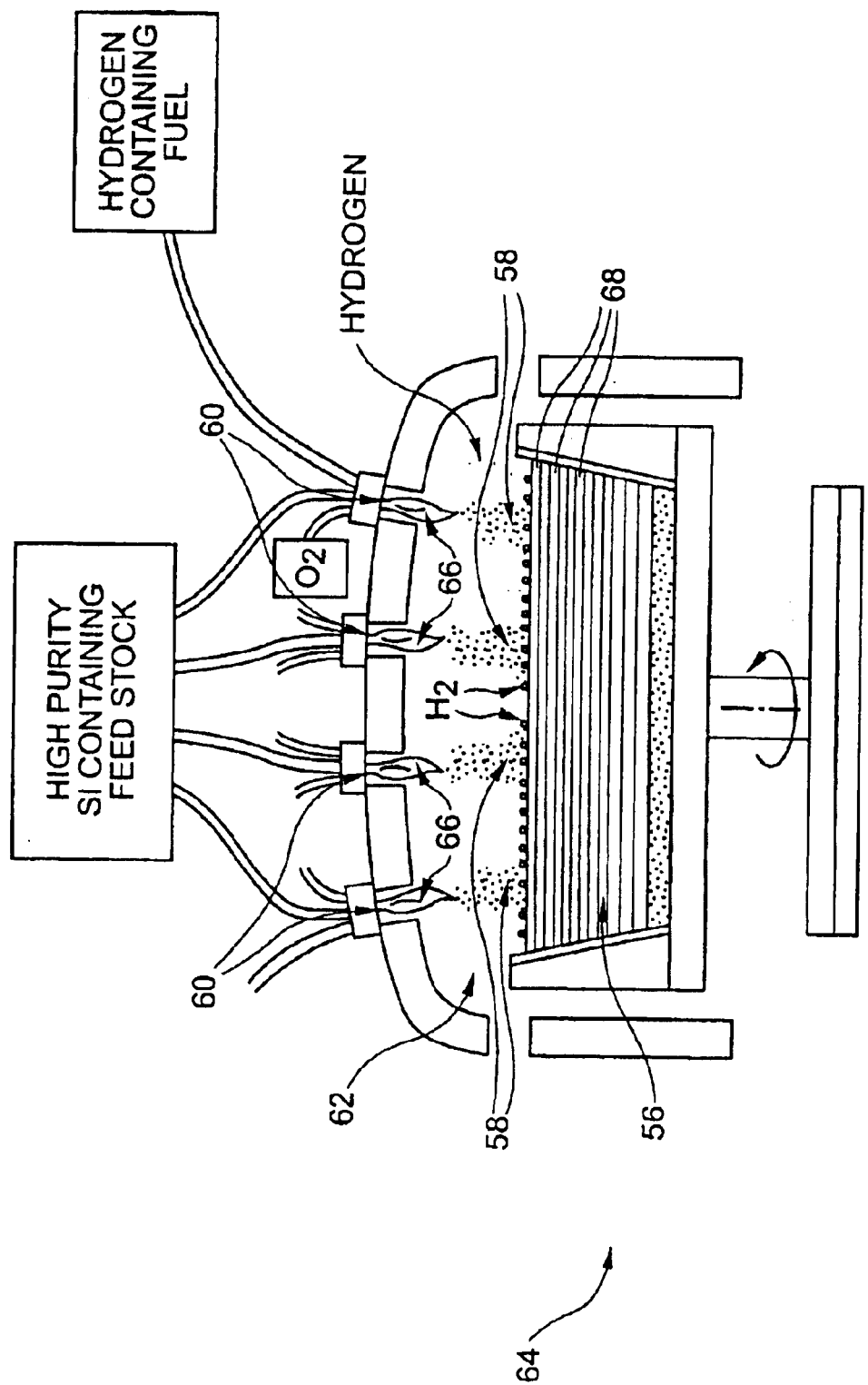
FIG. 14 illustrates a method in accordance with the invention.
Figure 15:
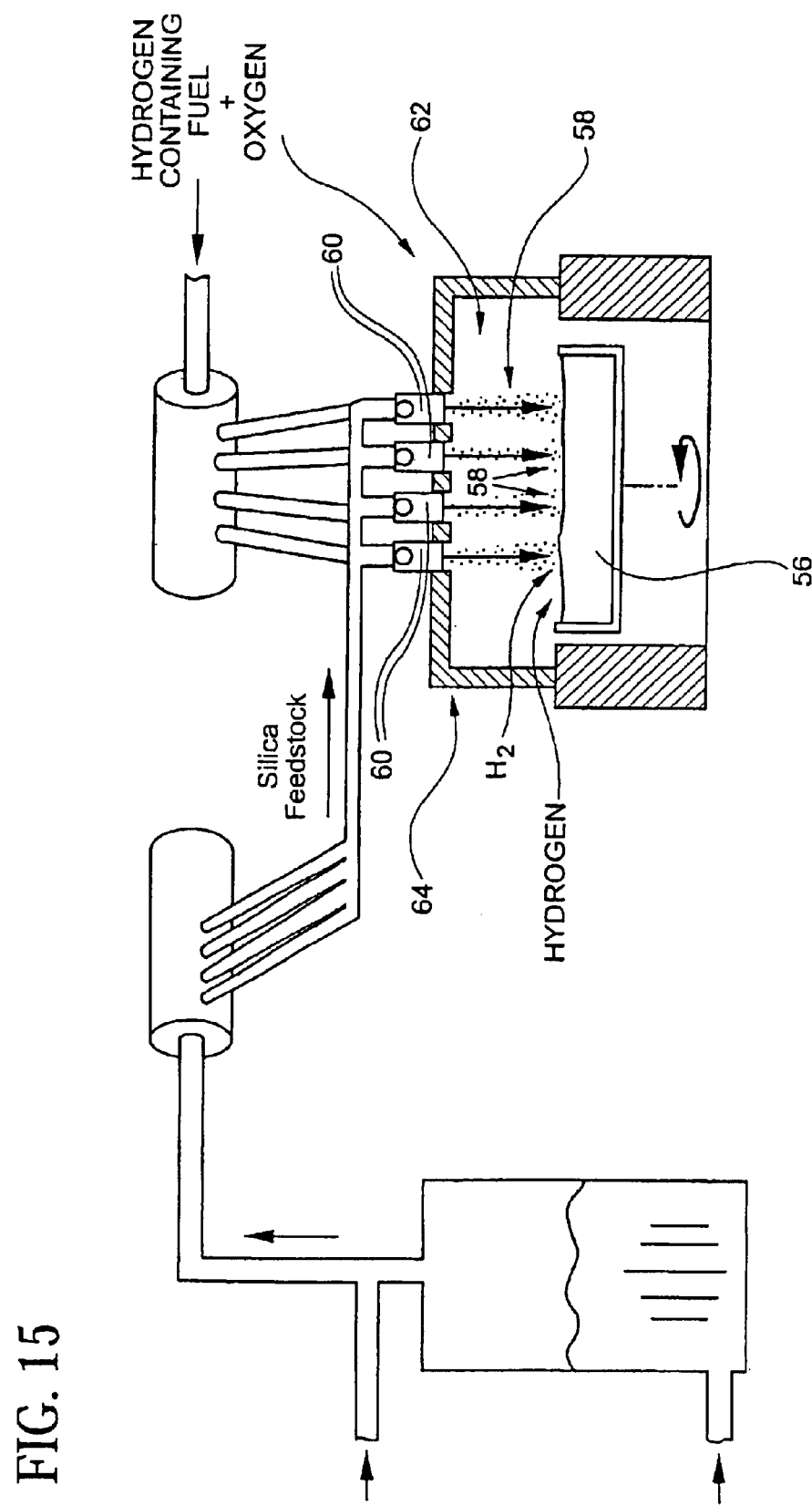
FIG. 15 illustrates a method in accordance with the invention.
Figure 16:
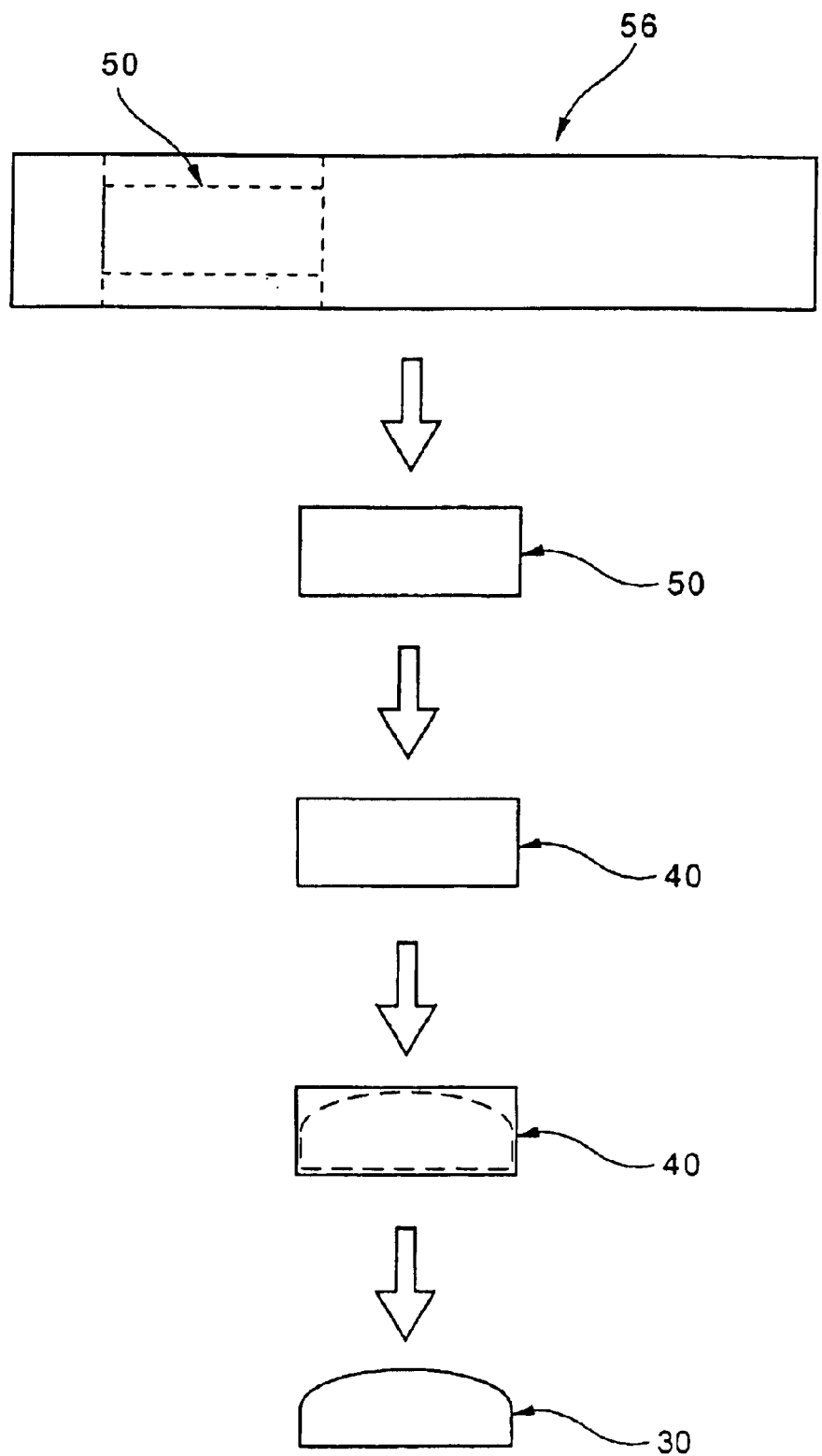
FIG. 16 illustrates a method in accordance with the invention.

In a preferred embodiment of the invention, providing fused silica glass having below 300 nm unbleached transmission T (%/cm) includes providing a non-impregnated hydrogen doped fused silica glass. Preferably hydrogen is indigenous to the fused silica glass and is not imported into the glass from the outside such as by a post-glass-forming impregnation process. As shown in FIGS. 14–15, providing fused silica glass 56 from which unexposed VUV-virgin fused silica glass preform 50 is taken includes providing a plurality of silica particles 58 in the presence of hydrogen wherein $H_2$ is incorporated into the fused silica glass 56 and preform 50 fused silica glass. As shown in FIGS. 14–15 hydrogen is preferably incorporated into the high purity fused silica glass of the invention during the direct deposition glass forming stage. Preferably the fused silica glass is produced by a one step flame hydrolysis process wherein a silica forming feedstock such as high purity Si containing feedstocks such as $SiCl_4$ or OMCTS (cyclic siloxane-octamethylcyclotetrasiloxane) is delivered to burners 60 of conversion site 62 inside heat containing direct-deposition fused silica boule furnace 64. The Si feedstock is converted in the flame hydrolysis conversion site burner flames 66 of burners 60 which are supplied with a hydrogen containing fuel, such as $CH_4$, $H_2$, natural gas, and oxygen, $O_2$. As shown in FIG. 16, the boule of fused silica glass 56 produced in the direct deposition furnace 64 is the source of unexposed virgin fused silica glass preform 50. Preform 50 is removed from its larger mother glass body by glass removal processes such as cutting and core drilling. Preform 50 is then photolytically exposed to provide photolytically improved transmitting fused silica glass lithography optical element preform body 40 which is then formed into lithography optical element 30. Preferably direct deposition forming of the fused silica glass body 56 includes forming silica particle 58 into fused molten silica glass body 56 in the presence of hydrogen wherein the resulting fused silica glass 56 and preforms 50 therefrom include SiH* radicals. The SiH* radicals formed in the high purity fused have a photolytically removable below 300 nm UV absorption. The inventive method of the invention converts these SiH* radicals into a less absorbing glass species by the <300 nm photonic exposure. As shown in FIG. 14 the direct deposition formed fused silica glass 56 has formed layered structure refractive index striae 68 and as shown in FIG. 16 the method includes inhibiting removal of the formed striae in glass 56. Removal of any striae present in the glass is inhibited by avoiding hot mechanical working of the glass such as homogenization and molding of the glass. The preform 50 is photolytically exposed without disturbing the glass structure prior thereto. Particularly homogenization of the glass to homogenize striae structure and mechanical hot working/kneading of the glass is avoided and not utilized. Photolytically exposing a glass preform 50 includes photolytically exposing a glass preform 50 that has not been homogenized hot worked/kneaded. Preferably providing fused silica glass 56 with SiH* radicals includes providing a fused silica glass 56 that has a $H_2$ content $<2\times10^{17}$ molecules/cm³.

The invention further includes a method of making an optical element fused silica glass 40. As shown in FIG. 11, the method comprises providing an optical element fused silica glass 50 having a below 300 nm unbleached internal transmission T (%/cm), photolytically exposing the fused silica glass with a <300 nm photonic exposure to provide a photolytically improved transmitting fused silica glass 40 with a below 300 nm increased internal transmittance IN (%/cm) with IN−T=Δtransmittance (%/cm) and Δtransmittance ≧0.07. The invention also includes utilizing the photolytically improved transmitting fused silica glass 40 to manipulate a plurality of photons with wavelengths ≦248 nm, such as forming the glass 40 of FIG. 10 into a lens 30 that is utilized in a lithography system as shown in FIGS. 1–4.

Preferably providing an optical element fused silica glass 50 having a below 300 nm unbleached internal transmission T (%/cm) includes providing an optical element fused silica glass 50 having a below 300 nm unbleached transmission T no greater than 99.92%/cm.

Photolytically exposing the glass 50 preferably provides a below 300 nm increased transmittance IN of at least 99.98%/cm.

In a preferred embodiment the method includes photolytically exposing the glass to increase the transmission of the glass such that Δ transmittance ≧0.09, more preferably such that Δ transmittance ≧0.16. The method of photolytically exposing fused silica glass 50 with a <300 nm photonic exposure includes providing a <300 nm light and impinging a <300 nm light 44 on the fused silica glass. As shown in FIGS. 12–13, the method includes optically manipulating and directing the <300 nm light with an optical management system such as with a beam expander or a reflecting integrating sphere. In an embodiment, the method includes providing a <300 nm laser light source, producing a <300 nm laser light beam, expanding the <300 nm laser light beam and impinging the expanded <300 nm laser light beam on fused silica glass 50. The laser beam can be continuous such as from a CW laser or pulsed as from an Excimer laser. As shown in FIG. 13 an embodiment of the invention includes a method which includes providing a <300 nm non-coherent light source 48, such as a discharge lamp, providing a reflective vessel 52, disposing the fused silica glass 50 in the reflective vessel 52, and impinging a <300 nm light 44 on the fused silica glass in the reflective vessel. Preferably the reflective vessel 52 is an integrating sphere which has UV<300 nm reflective surface 54, which preferably encloses glass 50.

The method of providing a fused silica glass having a below 300 nm unbleached transmission T (%/cm) includes providing a non-impregnated hydrogen doped fused silica glass 50. Preferably the glass 50 contains hydrogen that is indigenous to the glass, and not imported into the glass with an impregnation treatment. Preferably providing a fused silica glass 50 having a below 300 nm transmission T (%/cm) includes providing a plurality of silica particles 58 together in the presence of hydrogen wherein $H_2$ is incorporated into the fused silica glass 56, such as shown in the direct deposition processes of FIGS. 14–15 where $H_2$ is incorporated at the direct deposition glass forming stage. The method includes providing a silica precursor feedstock, feeding the silica feedstock to a conversion site burner 60, converting the silica feedstock with the conversion site burner into a plurality of silica soot particles 58, depositing the silica soot particles onto a heated fused silica surface of glass body 56 wherein the silica soot particles are fused into the heated fused silica surface and hydrogen molecules are incorporated into the fused silica glass 56. With this direct deposition process hydrogen in the glass is provided from the conversion site, its reactions, and the fuels and feedstocks delivered to the burners. Use of fuels having H (such as $H_2$, $CH_4$) and hydrogen containing feedstocks provides hydrogen in the conversion site. Preferably the direct deposition forming of the silica particles into a fused silica molten body in the presence of hydrogen provides resulting fused silica glass 56 which includes a plurality of SiH* species. The SiH* species in the glass have a photolytically removable below 300 nm UV absorption, wherein SiH* species can be converted to a less absorbing species by the exposure in accordance with the invention. As shown in FIG. 14 the invention includes a method wherein the direct deposition formed fused silica glass 56 has a formed layered structure refractive index striae 68 and the method includes inhibiting removal of the formed striae, particularly before the exposure step. Removal is inhibited by avoiding homogenization of the glass and avoiding mechanical hot working/kneading of the glass.

Preferably providing the fused silica glass having a below 300 nm unbleached transmission T (%/cm) includes providing a fused silica glass with a $H_2$ content $<2\times10^{18}H_2/cm^3$. Preferably providing the fused silica glass having a below 300 nm unbleached transmission T (%/cm) includes providing a fused silica glass with a homogeneous Na contaminant level, preferably with a contamination level less than 20 ppb at both the glass surface region and the interior of the glass. The invention further includes a method wherein providing the fused silica glass 50 includes providing a high purity fused silica glass member having a large dimension D>17 cm and a thickness TH>7 cm, preferably a disk shape with >8 inch diameter, 4 inch thick. High purity fused silica has high internal transmittance in the UV, high refractive index homogeneity, low birefringence and can be formed, shaped and polished into optical elements. Because the light sources used in modern lithographic stepper tools are excimer lasers, resistance to pulsed, high-energy light is also an important lifetime parameter.

Non-reacted molecular hydrogen ($H_2$) present in the fused silica glass can diminish the amount of induced absorption in the glass by reacting with laser radiation formed color centers to give hydrogen-containing species that are much less absorbing in the UV than the unpaired electron species depicted on the left side of equation 1.

Equatiion 1

Molecular $H_2$ is therefore normally viewed as a desirable entity in high purity fused silica. There are several ways of ensuring that $H_2$ is incorporated into the glass. A simple, but time-consuming method, is high-pressure infiltration impregnation of bulk pieces of glass with $H_2$ gas. This method is time intensive in that one has to rely on the diffusion constant of $H_2$ into silica. For practical purposes, a lens blank sized part (>8" diameter with a thickness of ~4 inches) would require 2282 days to load at a temperature of 350° C. With a loading temperature of 800° C., this time is decreased to 68 days. It is also noted that as higher loading temperatures are used to infiltrate the glass, $H_2$ reacts with the glass to yield SiOH and SiH. As will be demonstrated, this process and the reaction product SiH can be detrimental to the transmittance properties of the material. It is clear that not only is this a time intensive process but there are also considerable practical industrial manufacturing issues of using high temperature, high pressure $H_2$ gas to impregnate fused silica glass.

Producing the glass with incorporation of the $H_2$ during the actual formation of the high purity fused silica glass is the preferred method of providing optical element fused silica glass with a below 300 nm unbleached internal transmission and indigenous non-imported non-impregnated hydrogen in accordance with the invention. The preferred method of the invention as shown in FIGS. 14–15 utilizes a direct deposition flame hydrolysis process to make high purity fused silica with indigenous molecular $H_2$ incorporated into the fusing silica glass during the concurrent deposition and consolidation such as to provide a high purity fused silica glass wherein laser damage (color center formation) is minimized, no post processing of the glass such as index homogenization or hydrogen impregnation is necessary, and minimal SiH formation occurs.

By balancing fuel ($CH_4$, $H_2$), oxidant ($O_2$) and feed gases ($SiCl_4$, OMCTS cyclic siloxane) it is possible to achieve indigenous $H_2$ concentrations in the high purity fused silica glass from <$10^{16}$ molecules $H_2$/cc $SiO_2$ to $10^{18}$ molecules $H_2$/cc $SiO_2$, as measured by the stretch of the $H_2$ molecule by Raman spectroscopy.

We have observed an absorption feature in the Raman spectrum at 2260 $cm^{-1}$ in high purity fused silica glasses that were $H_2$-loaded and subsequently heated that correlates with the magnitude of the subsequent absorption spike behavior. The spectral position is close to where the SiH vibration is found in photolyzed samples of $H_2$-containing silicas (2280 $cm^{-1}$). We believe that the vibration at 2260 $cm^{-1}$ is due to an H-bonded SiH species (that we represent as SiH*) that is formed by the high temperature reaction of $H_2$ with silica and that this species is the photolyzable precursor that yields the Si E' center. The decrease in absorption is believed to be due to the reaction of the E' with H, the geminate recombination in equation C, which yields the SiH. To explain the decrease in absorption it is believed that the absorption cross-section of the SiH is significantly less than that of SiH*. The reactions are shown in equations A and B, where the precursor related to the initial absorption spike is denoted as SiH*. Equation C is written below, illustrating the reaction of the E' center with H to yield the SiH species.

Si—O—Si+$H_2$+heat→SiH*+SiOH*     Equation (A)

SiH*+hv→[E'+H]     Equation (B)

[E'+H]→SiH     Equation (C)

We have discovered that a consequence of the existence of SiH* that transmission of the fused silica glass can be improved by photolytically exposing the glass. We have found that the absorption in fused silica glass with the SiH* species is ultimately seen to go below the initial absorption measurement, that is, the glass becomes more transmitting with this treatment exposure. At short below 200 nm lithography wavelengths such as 193-nm there is absorption due to the low energy tail from the SiH* species that is removed by the photolytic exposure such as with the intense excimer source photolytic exposure. It is believed that the absorption cross-section of the SiH* is significantly larger than that of SiH.

An important practical consideration of SiH* is its influence on the initial transmittance at 193-nm and the removal of the SiH* to provide a fused silica glass with improved and induced transmission. In accordance with the invention high purity fused silica glass was measured with a spectrophotometer to provide a high precision internal transmittance measurement, then the glass was exposed to 193-nm excimer laser irradiation and then re-measured in the spectrophotometer. The spectrophotometric data showed an increase of 0.17% in transmittance at 193-nm, as a consequence of the disappearance of the SiH*.

In accordance with the invention the, photolytic exposure of the fused silica glass to UV light <300 nm results in increased transmittance of the glass at wavelengths below 300-nm. Excimer irradiation and continuous UV lamp sources have been shown to be efficient in this process.

In accordance with the invention the process of forming the fused silica glass at high temperature with conditions of high molecular $H_2$ ambient has been shown to result in the formation of a species in the glass referred to as SiH*. Within a given set of experimental or processing conditions the strength of the SiH* is well correlated with the final molecular $H_2$ content of the glass. This species is presumed to have an electronic transition at high energy (>6.4 eV); it is the low energy, long wavelength tail of this that absorbs at 193-nm. Photolysis of the SiH* diminishes its intensity by cleaving the Si—H* bond. Recombination of the silicon and hydrogen atoms yields a related SiH species that is different from the original SiH* radical. In accordance with the invention the resultant SiH species has a smaller absorption cross-section than that of the SiH* so that formation of this species is not detrimental to transmittance at 193-nm. The conversion of SiH* to SiH via a photolytic process by pre-exposure is the invented procedure for increasing transmittance at wavelengths below 300-nm.

In an embodiment, for exposure of large preform pieces (flood exposure) with respect to industrial manufacturing considerations, a beam expander is utilized to expand an excimer laser beam to provide the excimer irradiations. For lamp exposures a reflective vessel interior, such as that of an integrating sphere, large enough to hold the fused silica optical element preform parts is utilized to ensure homogenous exposure.

It has been observed (FIG. 17) that relatively higher $H_2$ in the glass is correlated with relatively lower 193-nm transmittance. Shown are data for two $H_2$ levels at constant impurity concentration. The transmittance in this case is measured by a spectrophotometer (Hitachi UV spectrometer) that employs a low power illumination source.

FIG. 18 shows a plot of induced 215-nm absorbance/cm vs. pulse number of 193 nm exposure for two fused silica glasses, one made by the flame hydrolysis process and the other made by using an impregnating high pressure $H_2$/high temperature post-glass-formation treatment. When the glasses are exposed to 193-nm excimer irradiation (6 $mJ/cm^2$/pulse), a very fast increase in absorption is seen. (Since the 215 center has significant absorption at 193-nm this measure serves as a measure of change in 193-nm transmittance). This absorption then decays with time to some lower level. Raman spectroscopy of the glasses treated with the conditions of high pressure $H_2$/high temperature shows the presence of an absorption assigned to a hydrogen-bonded species, which is called here, SiH* ($SiO_2$+$H_2 \rightarrow$SiH*+HOSi). The strength of this absorption is well correlated with the magnitude of the absorption spike suggesting that the two are related. As described herein, the presence of the SiH* is attributed to be responsible for the relatively lower transmittance of high purity fused silica glass, such as direct deposition Corning Incorporated HPFS® fused silica glass, as the $H_2$ content is raised. The photolysis of the center results in its diminishment and increased transmittance at 193-nm. The transient absorption is related to glass processing, particularly processing conditions of high $H_2$ concentration and time at temperature.

FIG. 19 shows a plot of induced 193-nm absorbance/cm vs. pulse number for glass made by direct deposition flame hydrolysis, also exposed using 193-nm light but at a much lower fluence (<1 mJ/cm$^2$/pulse, at a rep rate of 400 Hz) for a short time. Fluences of 1 mJ/cm$^2$/pulse and less are what would be expected in the lithographic optical element methods of the invention. This plot shows that the glass exhibits, after ~0.8 million pulses at the lower fluence, "induced transmittance", that is, the provided fused silica glass becomes more transmitting with exposure. The fused silica glass is more transmitting at 193 nm after exposure time of 2000 seconds (negative absorbance).

FIG. 20 contains the results of 193-nm transmittance measurements (reported as internal transmittance) made on two glasses of different $H_2$ contents. "Initial" transmittance is the 193-nm transmittance of the virgin fused silica glass as it was made, as measured using a spectrometer. The fused silica glass was then photolytically exposed to 1 million pulses of 193-nm excimer laser light at an exposure fluence of 1 mJ/cm$^2$/pulse. "Final" transmittance is the increased 193-nm transmittance of the fused silica glass, after this treatment, as measured using a spectrometer. An increase in transmittance of 0.12 to 0.17%/cm is noted. It is further observed that the higher increase in transmittance is measured in the higher $H_2$ sample. The –log (T/TO) zero line shows that photolytically exposing the fused silica glass improved its transmission below 200 nm (SiH*+hv→[Si H]).

A similar set of experiments were run using 248-nm excimer irradiation. For this set of experiments a fluence of 15 mJ/cm$^2$/pulse was used for 1E6 pulses. Based on laser-induced compaction work, excitation using 248-nm irradiation requires roughly 10× the fluence that 193-nm does, to achieve the same effect. That result suggests that the exposure conditions used for the 193 and 248 exposures are comparable. The 193-nm internal transmittance results, measured before and after the 248 exposure are shown in Table 1.

TABLE 1

| Glass | % T/cm Before T | % T/cm After IN | Change IN – T = Δ transmittance |
|---|---|---|---|
| 11801RM15, 20 mm | 99.45 | 99.62 | 0.17 |
| 11801RM15, 89 mm | 99.40 | 99.56 | 0.16 |
| 119907RM7B, 40 mm | 99.20 | 99.37 | 0.17 |
| 119907RM7B, 55 mm | 99.19 | 99.35 | 0.16 |

It was also noted that the transmittance at 248-nm is also increased after exposure as the data in Table 2 show.

TABLE 2

| Glass | % T/cm Before | % T/cm After | Change |
|---|---|---|---|
| 11801RM15, 20 mm | 99.92 | 99.99 | 0.07 |
| 11801RM15, 89 mm | 99.91 | 99.98 | 0.07 |
| 119907RM7B, 40 mm | 99.91 | 99.99 | 0.09 |
| 119907RM7B, 55 mm | 99.91 | 99.99 | 0.08 |

A set of fused silica glasses of various $H_2$ contents was also exposed to non-coherent continuous irradiation sources from lamps having output in the UV<300 nm range. The change in transmittance of glass having H2=2.3–3.2 molecules/cc that was subjected to 24 hours of exposure to a Xe lamp is shown in FIG. 21. An approximate increase of 0.15% was observed.

Low pressure mercury lamp exposure was also used to affect a transmittance increase. The data shown in FIG. 22 again show roughly a 0.2% increase in transmittance after 24 hours of exposure.

It will be apparent to those skilled in the art that various modifications and variations can be made to the present invention without departing from the spirit and scope of the invention. Thus, it is intended that the present invention covers the modifications and variations of this invention provided they come within the scope of the appended claims and their equivalents.

What is claimed is:

1. A method of making an optical element fused silica glass, said method comprising the steps of:
   providing an optical element fused silica glass having a below 300 nm unbleached internal transmission T (%/cm),
   photolytically exposing said fused silica glass with a photonic exposure in a 193–300 nm wavelength range to provide a photolytically improved transmitting fused silica glass with a below 300 nm increased internal transmittance IN (%/cm) with IN–T=Δtransmittance (%/cm) and Δtransmittance ≧0.07,
   wherein the step of photolytically exposing said fused silica glass is performed before the fused silica glass is shared into an optical element.

2. A method as claimed in claim 1, said method further including the step of utilizing said photolytically improved transmitting fused silica glass to manipulate a plurality of photons with wavelengths ≦248 nm.

3. A method as claimed in claim 1, wherein the optical element fused silica glass has a 248 nm unbleached transmission T no greater than 99.92%/cm.

4. A method as claimed in claim 1, wherein the step of photolytically exposing said glass provides a 248 nm increased transmittance IN of at least 99.98%/cm.

5. A method as claimed in claim 1, wherein Δtransmittance ≧0.09.

6. A method as claimed in claim 1, wherein Δtransmittance ≧0.16.

7. A method as claimed in claim 1, wherein the step of photolytically exposing said fused silica glass with said photonic exposure in the 193–300 nm wavelength range includes providing a light in the 193–300 nm wavelength range and impinging said light in the 193–300 nm wavelength range on said fused silica glass.

8. A method as claimed in claim 7 wherein said method includes optically manipulating said light in the 193–300 nm wavelength range.

9. A method as claimed in claim 8 wherein the step of photolytically exposing said fused silica glass includes providing a laser light source in the 193–300 nm wavelength range, producing a laser light beam in the 193–300 nm wavelength range, expanding said laser light beam and impinging said expanded laser light beam on said fused silica glass.

10. A method as claimed in claim 8 wherein the step of photolytically exposing said fused silica glass includes providing a non-coherent source of light in the 193–300 nm wavelength range, producing a reflective vessel, disposing said fused silica glass in said reflective vessel, impinging light in the 193–300 nm wavelength range on said fused silica glass in said reflective vessel.

11. A method as claimed in claim 1, wherein the step of providing said fused silica glass having said below 300 nm unbleached transmission T (%/cm) includes providing a non-impregnated hydrogen doped fused silica glass.

12. A method as claimed in claim 1, wherein the step of providing said fused silica glass having said below 300 nm transmission T (%/cm) includes providing a plurality of silica particles together in the presence of hydrogen, wherein H2 is incorporated into said fused silica glass.

13. A method as claimed in claim 12, wherein the step of providing said fused silica glass includes the steps of providing a silica precursor feedstock, feeding said silica feedstock to a conversion site burner, converting said silica feedstock with said conversion site burner into the plurality of silica particles, depositing said silica particles onto a heated fused silica surface wherein said silica particles are fused on said heated fused silica surface to form said fused silica glass and wherein hydrogen molecules are incorporated into the fused silica glass.

14. A method as claimed in claim 12, wherein the step of providing said fused silica glass includes the steps of direct deposition forming said silica particles into a fused silica molten body in the presence of said hydrogen wherein said provided resulting fused silica glass includes a plurality of SiH* species.

15. A method as claimed in claim 14, wherein said SiH* species have a photolytically removable below 300 nm UV absorption.

16. A method as claimed in claim 14, wherein said fused silica glass has a layered structure of refractive index striae and said method includes inhibiting removal of said formed striae.

17. A method as claimed in claim 1, wherein said fused silica glass having said below 300 nm unbleached transmission T (%/cm) has a H2 content $<2\times10^{18}H_2/cm^3$.

18. A method as claimed in claim 1, wherein said fused silica glass having said below 300 nm unbleached transmission T (%/cm) has a homogeneous Na contaminant level below 20 ppb.

19. A method as claimed in claim 1, wherein the step of photolytically exposing the glass includes exposing said glass to light in the 193–300 nm wavelength range with a predetermined transmission inducing fluence and for a predetermined transmission inducing exposure time wherein $\Delta transmittance \geq 0.10$.

20. A method as claimed in claim 19, wherein the step of photolytically exposing the glass is conducted with 193 nm light at a fluence of $<1$ mJ/cm$^2$/pulse at a repetition rate of at least 400 Hz and with $>800,000$ pulses.

21. A method as claimed in claim 19, wherein the step of photolytically exposing the glass is conducted with 248 nm light at a fluence $>15$ mJ/cm$^2$/pulse and at least one million pulses.

22. A method as claimed in claim 1, wherein the below 300 nm unbleached transmission T is $\leq 99.5\%$/cm at 193 nm and the glass is photolytically exposed into an increased transmittance IN $\geq 99.7\%$/cm at 193 nm.

23. A method as claimed in claim 1, wherein the below 300 nm unbleached transmission T is in the range from about 99.5 to 99.8%/cm at 193 nm and the glass is photolytically exposed into an increased transmittance IN $\geq 99.9\%$/cm at 193 nm.

24. A method as claimed in claim 1 wherein providing said fused silica glass includes providing a fused silica glass member having a large dimension D>17 cm and a thickness TH>7 cm.

25. A method as claimed in claim 1 wherein the step of photolytically exposing the glass is conducted with a light source selected from the group consisting of a 193 nm laser, a 248 nm laser, a low pressure mercury lamp, and a Xe lamp.

26. A method as claimed in claim 1 wherein the below 300 nm unbleached transmission T and the below 300 nm increased internal transmittance IN are measured at a wavelength selected from the group consisting of 193 nm and 248 nm.

27. A method as claimed in claim 1 wherein the step of photolytically exposing the glass increases the transmittance by destroying SiH* radicals in the glass.

* * * * *